(12) United States Patent
Anthony

(10) Patent No.: US 7,224,564 B2
(45) Date of Patent: *May 29, 2007

(54) AMALGAM OF SHIELDING AND SHIELDED ENERGY PATHWAYS AND OTHER ELEMENTS FOR SINGLE OR MULTIPLE CIRCUITRIES WITH COMMON REFERENCE NODE

(75) Inventor: William M. Anthony, Erie, PA (US)

(73) Assignee: X2Y Attenuators, LLC, Erie, PA (US)

(*) Notice: Subject to any disclaimer, the term of this patent is extended or adjusted under 35 U.S.C. 154(b) by 74 days.

This patent is subject to a terminal disclaimer.

(21) Appl. No.: 11/139,526

(22) Filed: May 31, 2005

(65) Prior Publication Data

US 2005/0248900 A1 Nov. 10, 2005

Related U.S. Application Data

(63) Continuation of application No. 10/399,590, filed as application No. PCT/US01/32480 on Oct. 17, 2001.

(60) Provisional application No. 60/241,128, filed on Oct. 17, 2000.

(51) Int. Cl.
*H02H 9/00* (2006.01)
(52) U.S. Cl. ..................................... 361/118
(58) Field of Classification Search ................. 361/118
See application file for complete search history.

(56) References Cited

U.S. PATENT DOCUMENTS 3,240,621 A    3/1966  Flower, Jr. et al.
3,343,034 A    9/1967  Ovshinsky
3,573,677 A    4/1971  Detar
3,742,420 A    6/1973  Harnden, jr.
3,790,858 A    2/1974  Brancaleone et al.
3,842,374 A   10/1974  Schlicke
4,023,071 A    5/1977  Fussell
4,119,084 A   10/1978  Eckels
4,135,132 A    1/1979  Tafjord
4,139,783 A    2/1979  Engeler
4,191,986 A    3/1980  ta Huang et al.
4,198,613 A    4/1980  Whitley
4,259,604 A    3/1981  Aoki (Continued)

FOREIGN PATENT DOCUMENTS

DE        197 28 692 A1    1/1999

(Continued)

OTHER PUBLICATIONS

PCT International Search Report for PCT/US01/48861, Oct. 1, 2002.

(Continued)

*Primary Examiner*—Stephen W. Jackson
(74) *Attorney, Agent, or Firm*—NeifeldIP Law, PC

(57) ABSTRACT

A predetermined single electrode shielding set for groupings of complementary electrodes that are operable to shield and that together are selectively formed or amalgamated into a predetermined sequential combination of commonly configured energy pathways operable for shielding various paired complementary electrodes and other predetermined elements that result in an electrode architecture practicable to provide multiple energy conditioning functions.

20 Claims, 3 Drawing Sheets

U.S. PATENT DOCUMENTS

| | | |
|---|---|---|
| 4,262,317 A | 4/1981 | Baumbach |
| 4,275,945 A | 6/1981 | Krantz et al. |
| 4,292,558 A | 9/1981 | Flick et al. |
| 4,308,509 A | 12/1981 | Tsuchiya et al. |
| 4,320,364 A | 3/1982 | Sakamoto et al. |
| 4,335,417 A | 6/1982 | Sakshaug et al. |
| 4,353,044 A | 10/1982 | Nossek |
| 4,366,456 A | 12/1982 | Ueno et al. |
| 4,384,263 A | 5/1983 | Neuman et al. |
| 4,394,639 A | 7/1983 | McGalliard |
| 4,412,146 A | 10/1983 | Futterer et al. |
| 4,494,092 A | 1/1985 | Griffin et al. |
| 4,533,931 A | 8/1985 | Mandai et al. |
| 4,553,114 A | 11/1985 | English et al. |
| 4,563,659 A | 1/1986 | Sakamoto |
| 4,586,104 A | 4/1986 | Standler |
| 4,587,589 A | 5/1986 | Marek |
| 4,590,537 A | 5/1986 | Sakamoto |
| 4,612,140 A | 9/1986 | Mandai et al. |
| 4,612,497 A | 9/1986 | Ulmer |
| 4,636,752 A | 1/1987 | Saito |
| 4,682,129 A | 7/1987 | Bakermans et al. |
| 4,685,025 A | 8/1987 | Carlomagno |
| 4,688,151 A | 8/1987 | Kraus et al. |
| 4,694,265 A | 9/1987 | Kupper |
| 4,698,721 A | 10/1987 | Warren |
| 4,703,386 A | 10/1987 | Speet et al. |
| 4,712,062 A | 12/1987 | Takamine |
| 4,713,540 A | 12/1987 | Gilby et al. |
| 4,720,760 A | 1/1988 | Starr |
| 4,746,557 A | 5/1988 | Sakamoto et al. |
| 4,752,752 A | 6/1988 | Okubo |
| 4,760,485 A | 7/1988 | Ari et al. |
| 4,772,225 A | 9/1988 | Ulery |
| 4,777,460 A | 10/1988 | Okubo |
| 4,780,598 A | 10/1988 | Fahey et al. |
| 4,782,311 A | 11/1988 | Ookubo |
| 4,789,847 A | 12/1988 | Sakamoto et al. |
| 4,794,485 A | 12/1988 | Bennett |
| 4,794,499 A | 12/1988 | Ott |
| 4,795,658 A | 1/1989 | Kano et al. |
| 4,799,070 A | 1/1989 | Nishikawa |
| 4,801,904 A | 1/1989 | Sakamoto et al. |
| 4,814,295 A | 3/1989 | Mehta |
| 4,814,938 A | 3/1989 | Arakawa et al. |
| 4,814,941 A | 3/1989 | Speet et al. |
| 4,819,126 A | 4/1989 | Kornrumpf et al. |
| 4,845,606 A | 7/1989 | Herbert |
| 4,847,730 A | 7/1989 | Konno et al. |
| 4,904,967 A | 2/1990 | Morii et al. |
| 4,908,586 A | 3/1990 | Kling et al. |
| 4,908,590 A | 3/1990 | Sakamoto et al. |
| 4,924,340 A | 5/1990 | Sweet |
| 4,942,353 A | 7/1990 | Herbert et al. |
| 4,967,315 A | 10/1990 | Schelhorn |
| 4,978,906 A | 12/1990 | Herbert et al. |
| 4,990,202 A | 2/1991 | Murata et al. |
| 4,999,595 A | 3/1991 | Azumi et al. |
| 5,029,062 A | 7/1991 | Capel |
| 5,034,709 A | 7/1991 | Azumi et al. |
| 5,034,710 A | 7/1991 | Kawaguchi |
| 5,051,712 A | 9/1991 | Naito et al. |
| 5,059,140 A | 10/1991 | Philippson et al. |
| 5,065,284 A | 11/1991 | Hernandez |
| 5,073,523 A | 12/1991 | Yamada et al. |
| 5,079,069 A | 1/1992 | Howard et al. |
| 5,079,223 A | 1/1992 | Maroni |
| 5,079,669 A | 1/1992 | Williams |
| 5,089,688 A | 2/1992 | Fang et al. |
| 5,105,333 A | 4/1992 | Yamano et al. |
| 5,107,394 A | 4/1992 | Naito et al. |
| 5,109,206 A | 4/1992 | Carlile |
| 5,140,297 A | 8/1992 | Jacobs et al. |
| 5,140,497 A | 8/1992 | Kato et al. |
| 5,142,430 A | 8/1992 | Anthony |
| 5,148,005 A | 9/1992 | Fang et al. |
| 5,155,655 A | 10/1992 | Howard et al. |
| 5,161,086 A | 11/1992 | Howard et al. |
| 5,167,483 A | 12/1992 | Gardiner |
| 5,173,670 A | 12/1992 | Naito et al. |
| 5,179,362 A | 1/1993 | Okochi et al. |
| 5,181,859 A | 1/1993 | Foreman et al. |
| 5,186,647 A | 2/1993 | Denkmann et al. |
| 5,208,502 A | 5/1993 | Yamashita et al. |
| 5,219,812 A | 6/1993 | Doi et al. |
| 5,220,480 A | 6/1993 | Kershaw, Jr. et al. |
| 5,236,376 A | 8/1993 | Cohen |
| 5,243,308 A | 9/1993 | Shusterman et al. |
| 5,251,092 A | 10/1993 | Brady et al. |
| 5,257,950 A | 11/1993 | Lenker et al. |
| 5,261,153 A | 11/1993 | Lucas |
| 5,262,611 A | 11/1993 | Danysh et al. |
| 5,268,810 A | 12/1993 | DiMarco et al. |
| 5,290,191 A | 3/1994 | Foreman et al. |
| 5,299,956 A | 4/1994 | Brownell et al. |
| 5,300,760 A | 4/1994 | Batliwalla et al. |
| 5,310,363 A | 5/1994 | Brownell et al. |
| 5,311,408 A | 5/1994 | Ferchau et al. |
| 5,321,373 A | 6/1994 | Shusterman et al. |
| 5,321,573 A | 6/1994 | Person et al. |
| 5,326,284 A | 7/1994 | Bohbot et al. |
| 5,337,028 A | 8/1994 | White |
| 5,353,189 A | 10/1994 | Tomlinson |
| 5,353,202 A | 10/1994 | Ansell et al. |
| 5,357,568 A | 10/1994 | Pelegris |
| 5,362,249 A | 11/1994 | Carter |
| 5,362,254 A | 11/1994 | Siemon et al. |
| 5,378,407 A | 1/1995 | Chandler et al. |
| 5,382,928 A | 1/1995 | Davis et al. |
| 5,382,938 A | 1/1995 | Hansson et al. |
| 5,386,335 A | 1/1995 | Amano et al. |
| 5,396,201 A | 3/1995 | Ishizaki et al. |
| 5,401,952 A | 3/1995 | Sugawa |
| 5,405,466 A | 4/1995 | Naito et al. |
| 5,414,393 A | 5/1995 | Rose et al. |
| 5,414,587 A | 5/1995 | Kiser et al. |
| 5,420,553 A | 5/1995 | Sakamoto et al. |
| 5,432,484 A | 7/1995 | Klas et al. |
| 5,446,625 A | 8/1995 | Urbish et al. |
| 5,450,278 A | 9/1995 | Lee et al. |
| 5,451,919 A | 9/1995 | Chu et al. |
| RE35,064 E | 10/1995 | Hernandez |
| 5,455,734 A | 10/1995 | Foreman et al. |
| 5,461,351 A | 10/1995 | Shusterman |
| 5,463,232 A | 10/1995 | Yamashita et al. |
| 5,471,035 A | 11/1995 | Holmes |
| 5,477,933 A | 12/1995 | Nguyen |
| 5,481,238 A | 1/1996 | Carsten et al. |
| 5,483,407 A | 1/1996 | Anastasio et al. |
| 5,488,540 A | 1/1996 | Hatta |
| 5,491,299 A | 2/1996 | Naylor et al. |
| 5,493,260 A | 2/1996 | Park |
| 5,495,180 A | 2/1996 | Huang et al. |
| 5,500,629 A | 3/1996 | Meyer |
| 5,500,785 A | 3/1996 | Funada |
| 5,512,196 A | 4/1996 | Mantese et al. |
| 5,531,003 A | 7/1996 | Seifried et al. |
| 5,534,837 A | 7/1996 | Brandt |
| 5,535,101 A | 7/1996 | Miles et al. |
| 5,536,978 A | 7/1996 | Cooper et al. |
| 5,541,482 A | 7/1996 | Siao |
| 5,544,002 A | 8/1996 | Iwaya et al. |
| 5,546,058 A | 8/1996 | Azuma et al. |
| 5,548,255 A | 8/1996 | Spielman |

| | | | | | | |
|---|---|---|---|---|---|---|
| 5,555,150 | A | 9/1996 | Newman, Jr. | 6,038,121 | A | 3/2000 | Naito et al. |
| 5,568,348 | A | 10/1996 | Foreman et al. | 6,042,685 | A | 3/2000 | Shinada et al. |
| 5,570,278 | A | 10/1996 | Cross | 6,046,898 | A | 4/2000 | Seymour et al. |
| 5,583,359 | A | 12/1996 | Ng et al. | 6,052,038 | A | 4/2000 | Savicki |
| 5,586,007 | A | 12/1996 | Funada | 6,061,227 | A | 5/2000 | Nogi |
| 5,592,391 | A | 1/1997 | Muyshondt et al. | 6,064,286 | A | 5/2000 | Ziegner et al. |
| 5,612,657 | A | 3/1997 | Kledzik | 6,072,687 | A | 6/2000 | Naito et al. |
| 5,614,881 | A | 3/1997 | Duggal et al. | 6,075,211 | A | 6/2000 | Tohya et al. |
| 5,619,079 | A | 4/1997 | Wiggins et al. | 6,078,117 | A | 6/2000 | Perrin et al. |
| 5,624,592 | A | 4/1997 | Paustian | 6,078,229 | A | 6/2000 | Funada et al. |
| 5,640,048 | A | 6/1997 | Selna | 6,088,235 | A | 7/2000 | Chiao et al. |
| 5,645,746 | A | 7/1997 | Walsh | 6,091,310 | A | 7/2000 | Utsumi et al. |
| 5,647,766 | A | 7/1997 | Nguyen | 6,092,269 | A | 7/2000 | Yializis et al. |
| 5,668,511 | A | 9/1997 | Furutani et al. | 6,094,112 | A | 7/2000 | Goldberger et al. |
| 5,682,303 | A | 10/1997 | Goad | 6,094,339 | A | 7/2000 | Evans |
| 5,700,167 | A | 12/1997 | Pharney et al. | 6,097,260 | A | 8/2000 | Whybrew et al. |
| 5,708,553 | A | 1/1998 | Hung | 6,097,581 | A | 8/2000 | Anthony |
| 5,719,450 | A | 2/1998 | Vora | 6,104,258 | A | 8/2000 | Novak |
| 5,719,477 | A | 2/1998 | Tomihari | 6,104,599 | A | 8/2000 | Ahiko et al. |
| 5,719,750 | A | 2/1998 | Iwane | 6,108,448 | A | 8/2000 | Song et al. |
| 5,751,539 | A | 5/1998 | Stevenson et al. | 6,111,479 | A | 8/2000 | Myohga et al. |
| 5,767,446 | A | 6/1998 | Ha et al. | 6,120,326 | A | 9/2000 | Brooks |
| 5,789,999 | A | 8/1998 | Barnett et al. | 6,121,761 | A | 9/2000 | Herbert |
| 5,790,368 | A | 8/1998 | Naito et al. | 6,125,044 | A | 9/2000 | Cherniski et al. |
| 5,796,568 | A | 8/1998 | Baiatu | 6,130,585 | A | 10/2000 | Whybrew et al. |
| 5,796,595 | A | 8/1998 | Cross | 6,137,392 | A | 10/2000 | Herbert |
| 5,797,770 | A | 8/1998 | Davis et al. | 6,142,831 | A | 11/2000 | Ashman et al. |
| 5,808,873 | A | 9/1998 | Celaya et al. | 6,144,547 | A | 11/2000 | Retseptor |
| 5,825,628 | A | 10/1998 | Garbelli et al. | 6,147,587 | A | 11/2000 | Hadano et al. |
| 5,828,093 | A | 10/1998 | Naito et al. | 6,150,895 | A | 11/2000 | Steigerwald et al. |
| 5,828,272 | A | 10/1998 | Romerein et al. | 6,157,528 | A | 12/2000 | Anthony |
| 5,828,555 | A | 10/1998 | Itoh | 6,157,547 | A | 12/2000 | Brown et al. |
| 5,831,489 | A | 11/1998 | Wire | 6,163,454 | A | 12/2000 | Strickler |
| 5,834,992 | A | 11/1998 | Kato et al. | 6,163,456 | A | 12/2000 | Suzuki et al. |
| 5,838,216 | A | 11/1998 | White et al. | 6,165,814 | A | 12/2000 | Wark et al. |
| 5,867,361 | A | 2/1999 | Wolf et al. | 6,175,287 | B1 | 1/2001 | Lampen et al. |
| 5,870,272 | A | 2/1999 | Seifried et al. | 6,180,588 | B1 | 1/2001 | Walters |
| 5,875,099 | A | 2/1999 | Maesaka et al. | 6,181,231 | B1 | 1/2001 | Bartilson |
| 5,880,925 | A | 3/1999 | DuPre et al. | 6,183,685 | B1 | 2/2001 | Cowman et al. |
| 5,889,445 | A | 3/1999 | Ritter et al. | 6,185,091 | B1 | 2/2001 | Tanahashi et al. |
| 5,895,990 | A | 4/1999 | Lau | 6,188,565 | B1 | 2/2001 | Naito et al. |
| 5,898,403 | A | 4/1999 | Saitoh et al. | 6,191,475 | B1 | 2/2001 | Skinner et al. |
| 5,898,562 | A | 4/1999 | Cain et al. | 6,191,669 | B1 | 2/2001 | Shigemura |
| 5,905,627 | A | 5/1999 | Brendel et al. | 6,191,932 | B1 | 2/2001 | Kuroda et al. |
| 5,907,265 | A | 5/1999 | Sakuragawa et al. | 6,195,269 | B1 | 2/2001 | Hino |
| 5,908,151 | A | 6/1999 | Elias | 6,198,123 | B1 | 3/2001 | Linder et al. |
| 5,909,155 | A | 6/1999 | Anderson et al. | 6,198,362 | B1 | 3/2001 | Harada et al. |
| 5,909,350 | A | 6/1999 | Anthony | 6,204,448 | B1 | 3/2001 | Garland et al. |
| 5,910,755 | A | 6/1999 | Mishiro et al. | 6,205,014 | B1 | 3/2001 | Inomata et al. |
| 5,912,809 | A | 6/1999 | Steigerwald et al. | 6,207,081 | B1 | 3/2001 | Sasaki et al. |
| 5,917,388 | A | 6/1999 | Tronche et al. | 6,208,063 | B1 | 3/2001 | Horikawa |
| 5,926,377 | A | 7/1999 | Nakao et al. | 6,208,225 | B1 | 3/2001 | Miller |
| 5,928,076 | A | 7/1999 | Clements et al. | 6,208,226 | B1 | 3/2001 | Chen et al. |
| 5,955,930 | A | 9/1999 | Anderson et al. | 6,208,494 | B1 | 3/2001 | Nakura et al. |
| 5,959,829 | A | 9/1999 | Stevenson et al. | 6,208,495 | B1 | 3/2001 | Wieloch et al. |
| 5,959,846 | A | 9/1999 | Noguchi et al. | 6,208,501 | B1 | 3/2001 | Ingalls et al. |
| 5,969,461 | A | 10/1999 | Anderson et al. | 6,208,502 | B1 | 3/2001 | Hudis et al. |
| 5,977,845 | A | 11/1999 | Kitahara | 6,208,503 | B1 | 3/2001 | Shimada et al. |
| 5,978,231 | A | 11/1999 | Tohya et al. | 6,208,521 | B1 | 3/2001 | Nakatsuka |
| 5,980,718 | A | 11/1999 | Van Konynenburg et al. | 6,208,525 | B1 | 3/2001 | Imasu et al. |
| 5,995,352 | A | 11/1999 | Gumley | 6,211,754 | B1 | 4/2001 | Nishida et al. |
| 5,999,067 | A | 12/1999 | D'Ostilio | 6,212,078 | B1 | 4/2001 | Hunt et al. |
| 5,999,398 | A | 12/1999 | Makl et al. | 6,215,647 | B1 | 4/2001 | Naito et al. |
| 6,004,752 | A | 12/1999 | Loewy et al. | 6,215,649 | B1 | 4/2001 | Appelt et al. |
| 6,013,957 | A | 1/2000 | Puzo et al. | 6,218,631 | B1 | 4/2001 | Hetzel et al. |
| 6,016,095 | A | 1/2000 | Herbert | 6,219,240 | B1 | 4/2001 | Sasov |
| 6,018,448 | A | 1/2000 | Anthony | 6,222,427 | B1 | 4/2001 | Kato et al. |
| 6,021,564 | A | 2/2000 | Hanson | 6,222,431 | B1 | 4/2001 | Ishizaki et al. |
| 6,023,406 | A | 2/2000 | Kinoshita et al. | 6,225,876 | B1 | 5/2001 | Akino et al. |
| 6,031,710 | A | 2/2000 | Wolf et al. | 6,226,169 | B1 | 5/2001 | Naito et al. |
| 6,034,576 | A | 3/2000 | Kuth | 6,226,182 | B1 | 5/2001 | Maehara |
| 6,034,864 | A | 3/2000 | Naito et al. | 6,229,226 | B1 | 5/2001 | Kramer et al. |
| 6,037,846 | A | 3/2000 | Oberhammer | 6,236,572 | B1 | 5/2001 | Teshome et al. |

| | | | | | |
|---|---|---|---|---|---|
| 6,240,621 B1 | 6/2001 | Nellissen et al. | 2001/0009496 A1 | 7/2001 | Kappel et al. |
| 6,243,253 B1 | 6/2001 | DuPre et al. | 2001/0010444 A1 | 8/2001 | Pahl et al. |
| 6,249,047 B1 | 6/2001 | Corisis | 2001/0011763 A1 | 8/2001 | Ushijima et al. |
| 6,249,439 B1 | 6/2001 | DeMore et al. | 2001/0011934 A1 | 8/2001 | Yamamoto |
| 6,252,161 B1 | 6/2001 | Hailey et al. | 2001/0011937 A1 | 8/2001 | Satoh et al. |
| 6,262,895 B1 | 7/2001 | Forthun | 2001/0013626 A1 | 8/2001 | Fujii |
| 6,266,228 B1 | 7/2001 | Naito et al. | 2001/0015643 A1 | 8/2001 | Goldfine et al. |
| 6,266,229 B1 | 7/2001 | Naito et al. | 2001/0015683 A1 | 8/2001 | Mikami et al. |
| 6,272,003 B1 | 8/2001 | Schaper | 2001/0017576 A1 | 8/2001 | Kondo et al. |
| 6,282,074 B1 | 8/2001 | Anthony | 2001/0017579 A1 | 8/2001 | Kurata |
| 6,282,079 B1 | 8/2001 | Nagakari et al. | 2001/0019869 A1 | 9/2001 | Hsu |
| 6,285,109 B1 | 9/2001 | Katagiri et al. | 2001/0020879 A1 | 9/2001 | Takahashi et al. |
| 6,285,542 B1 | 9/2001 | Kennedy, III et al. | 2001/0021097 A1 | 9/2001 | Ohya et al. |
| 6,292,350 B1 | 9/2001 | Naito et al. | 2001/0022547 A1 | 9/2001 | Murata et al. |
| 6,292,351 B1 | 9/2001 | Ahiko et al. | 2001/0023983 A1 | 9/2001 | Kobayashi et al. |
| 6,309,245 B1 | 10/2001 | Sweeney | 2001/0024148 A1 | 9/2001 | Gerstenberg et al. |
| 6,310,286 B1 | 10/2001 | Troxel et al. | 2001/0028581 A1 | 10/2001 | Yanagisawa et al. |
| 6,313,584 B1 | 11/2001 | Johnson et al. | 2001/0029648 A1 | 10/2001 | Ikada et al. |
| 6,320,547 B1 | 11/2001 | Fathy et al. | 2001/0031191 A1 | 10/2001 | Korenaga |
| 6,324,047 B1 | 11/2001 | Hayworth | 2001/0033664 A1 | 10/2001 | Poux et al. |
| 6,324,048 B1 | 11/2001 | Liu | 2001/0035801 A1 | 11/2001 | Gilbert |
| 6,325,672 B1 | 12/2001 | Belopolsky et al. | 2001/0035802 A1 | 11/2001 | Kadota |
| 6,327,134 B1 | 12/2001 | Kuroda et al. | 2001/0035805 A1 | 11/2001 | Suzuki et al. |
| 6,327,137 B1 | 12/2001 | Yamamoto et al. | 2001/0037680 A1 | 11/2001 | Buck et al. |
| 6,331,926 B1 | 12/2001 | Anthony | 2001/0039834 A1 | 11/2001 | Hsu |
| 6,331,930 B1 | 12/2001 | Kuroda | 2001/0040484 A1 | 11/2001 | Kim |
| 6,342,681 B1 | 1/2002 | Goldberger et al. | 2001/0040487 A1 | 11/2001 | Ikata et al. |
| 6,373,673 B1 | 4/2002 | Anthony | 2001/0040488 A1 | 11/2001 | Gould et al. |
| 6,388,856 B1 | 5/2002 | Anthony | 2001/0041305 A1 | 11/2001 | Sawada et al. |
| 6,395,996 B1 | 5/2002 | Tsai et al. | 2001/0043100 A1 | 11/2001 | Tomita et al. |
| 6,448,873 B1 | 9/2002 | Mostov | 2001/0043129 A1 | 11/2001 | Hidaka et al. |
| 6,456,481 B1 | 9/2002 | Stevenson | 2001/0043450 A1 | 11/2001 | Seale et al. |
| 6,469,595 B2 | 10/2002 | Anthony et al. | 2001/0043453 A1 | 11/2001 | Narwankar et al. |
| 6,498,710 B1 | 12/2002 | Anthony | 2001/0045810 A1 | 11/2001 | Poon et al. |
| 6,504,451 B1 | 1/2003 | Yamaguchi | 2001/0048581 A1 | 12/2001 | Anthony et al. |
| 6,509,807 B1 | 1/2003 | Anthony et al. | 2001/0048593 A1 | 12/2001 | Yamauchi et al. |
| 6,510,038 B1 | 1/2003 | Satou et al. | 2001/0048906 A1 | 12/2001 | Lau et al. |
| 6,522,516 B2 | 2/2003 | Anthony | 2001/0050550 A1 | 12/2001 | Yoshida et al. |
| 6,549,389 B2 | 4/2003 | Anthony et al. | 2001/0050600 A1 | 12/2001 | Anthony et al. |
| 6,563,688 B2 | 5/2003 | Anthony et al. | 2001/0050837 A1 | 12/2001 | Stevenson et al. |
| 6,580,595 B2 | 6/2003 | Anthony et al. | 2001/0052833 A1 | 12/2001 | Enokihara et al. |
| 6,594,128 B2 | 7/2003 | Anthony | 2001/0054512 A1 | 12/2001 | Belau et al. |
| 6,603,372 B1 | 8/2003 | Ishizaki et al. | 2001/0054734 A1 | 12/2001 | Koh et al. |
| 6,603,646 B2 | 8/2003 | Anthony et al. | 2001/0054756 A1 | 12/2001 | Horiuchi et al. |
| 6,606,011 B2 | 8/2003 | Anthony et al. | 2001/0054936 A1 | 12/2001 | Okada et al. |
| 6,606,237 B1 | 8/2003 | Naito et al. | 2002/0000521 A1 | 1/2002 | Brown |
| 6,618,268 B2 | 9/2003 | Dibene, II et al. | 2002/0000583 A1 | 1/2002 | Kitsukawa et al. |
| 6,636,406 B1 | 10/2003 | Anthony | 2002/0000821 A1 | 1/2002 | Haga et al. |
| 6,650,525 B2 | 11/2003 | Anthony | 2002/0000893 A1 | 1/2002 | Hidaka et al. |
| 6,687,108 B1 | 2/2004 | Anthony et al. | 2002/0000895 A1 | 1/2002 | Takahashi et al. |
| 6,696,952 B2 | 2/2004 | Zirbes | 2002/0003454 A1 | 1/2002 | Sweeney et al. |
| 6,717,301 B2 | 4/2004 | DeDaran et al. | 2002/0005880 A1 | 1/2002 | Ashe et al. |
| 6,738,249 B1 | 5/2004 | Anthony et al. | 2002/0024787 A1 | 2/2002 | Anthony |
| 6,806,806 B2 | 10/2004 | Anthony | 2002/0027263 A1 | 3/2002 | Anthony et al. |
| 6,873,513 B2 | 3/2005 | Anthony | 2002/0027760 A1 | 3/2002 | Anthony |
| 6,894,884 B2 * | 5/2005 | Anthony et al. ............ 361/118 | 2002/0044401 A1 | 4/2002 | Anthony et al. |
| 6,950,293 B2 | 9/2005 | Anthony | 2002/0075096 A1 | 6/2002 | Anthony |
| 6,954,346 B2 | 10/2005 | Anthony | 2002/0079116 A1 | 6/2002 | Anthony |
| 6,995,983 B1 | 2/2006 | Anthony et al. | 2002/0089812 A1 | 7/2002 | Anthony et al. |
| 7,042,303 B2 | 5/2006 | Anthony et al. | 2002/0113663 A1 | 8/2002 | Anthony et al. |
| 7,042,703 B2 | 5/2006 | Anthony et al. | 2002/0122286 A1 | 9/2002 | Anthony |
| 7,050,284 B2 | 5/2006 | Anthony | 2002/0131231 A1 | 9/2002 | Anthony |
| 7,106,570 B2 | 9/2006 | Anthony, Jr. et al. | 2002/0149900 A1 | 10/2002 | Anthony |
| 7,110,227 B2 | 9/2006 | Anthony et al. | 2002/0158515 A1 | 10/2002 | Anthony, Jr. et al. |
| 7,110,235 B2 | 9/2006 | Anthony, Jr. et al. | 2002/0186100 A1 | 12/2002 | Anthony et al. |
| 7,113,383 B2 | 9/2006 | Anthony et al. | 2003/0029632 A1 | 2/2003 | Anthony, Jr. et al. |
| 2001/0001989 A1 | 5/2001 | Smith | 2003/0029635 A1 | 2/2003 | Anthony, Jr. et al. |
| 2001/0002105 A1 | 5/2001 | Brandelik et al. | 2003/0048029 A1 | 3/2003 | DeDaran et al. |
| 2001/0002624 A1 | 6/2001 | Khandros et al. | 2003/0067730 A1 | 4/2003 | Anthony et al. |
| 2001/0008288 A1 | 7/2001 | Kimura et al. | 2003/0161086 A1 | 8/2003 | Anthony |
| 2001/0008302 A1 | 7/2001 | Murakami et al. | 2003/0202312 A1 | 10/2003 | Anthony et al. |
| 2001/0008478 A1 | 7/2001 | McIntosh et al. | 2003/0206388 A9 | 11/2003 | Anthony et al. |
| 2001/0008509 A1 | 7/2001 | Watanabe | 2003/0210125 A1 | 11/2003 | Anthony |

| | | | |
|---|---|---|---|
| 2003/0231451 A1 | 12/2003 | Anthony | |
| 2003/0231456 A1 | 12/2003 | Anthony et al. | |
| 2004/0004802 A1 | 1/2004 | Anthony et al. | |
| 2004/0008466 A1 | 1/2004 | Anthony et al. | |
| 2004/0027771 A1 | 2/2004 | Anthony | |
| 2004/0032304 A1 | 2/2004 | Anthony et al. | |
| 2004/0054426 A1 | 3/2004 | Anthony | |
| 2004/0085699 A1 | 5/2004 | Anthony | |
| 2004/0105205 A1 | 6/2004 | Anthony et al. | |
| 2004/0124949 A1 | 7/2004 | Anthony et al. | |
| 2004/0130840 A1 | 7/2004 | Anthony | |
| 2004/0218332 A1 | 11/2004 | Anthony et al. | |
| 2004/0226733 A1 | 11/2004 | Anthony et al. | |
| 2005/0016761 A9 | 1/2005 | Anthony, Jr. et al. | |
| 2005/0018374 A1 | 1/2005 | Anthony | |
| 2005/0063127 A1 | 3/2005 | Anthony | |
| 2005/0248900 A1 | 11/2005 | Anthony | |
| 2005/0286198 A1 | 12/2005 | Anthony et al. | |
| 2006/0023385 A9 | 2/2006 | Anthony et al. | |
| 2006/0139836 A1 | 6/2006 | Anthony | |
| 2006/0139837 A1 | 6/2006 | Anthony et al. | |
| 2006/0193051 A1 | 8/2006 | Anthony et al. | |
| 2006/0203414 A1 | 9/2006 | Anthony | |

FOREIGN PATENT DOCUMENTS

| | | |
|---|---|---|
| DE | 198 57 043 C1 | 3/2000 |
| EP | 0623363 | 11/1994 |
| EP | 98915364 | 11/1994 |
| EP | JP8172025 | 7/1996 |
| EP | 0776016 | 5/1997 |
| EP | 0933871 | 8/1999 |
| EP | 1022751 | 7/2000 |
| EP | 1024507 | 8/2000 |
| EP | 1061535 | 12/2000 |
| FR | 2765417 | 12/1998 |
| FR | 2808135 | 10/2001 |
| GB | 2217136 | 4/1988 |
| JP | 63-269509 | 11/1988 |
| JP | 1-27251 | 1/1989 |
| JP | 02-267879 | 11/1990 |
| JP | 03-018112 | 1/1991 |
| JP | 5-283284 | 10/1993 |
| JP | 05-299292 | 11/1993 |
| JP | 06-053048 | 2/1994 |
| JP | 06-053049 | 2/1994 |
| JP | 06-053075 | 2/1994 |
| JP | 06-053077 | 2/1994 |
| JP | 06-053078 | 2/1994 |
| JP | 06-084695 | 3/1994 |
| JP | 06-151014 | 5/1994 |
| JP | 06-151244 | 5/1994 |
| JP | 06-151245 | 5/1994 |
| JP | 06-325977 | 11/1994 |
| JP | 07-235406 | 9/1995 |
| JP | 07-235852 | 9/1995 |
| JP | 07-240651 | 9/1995 |
| JP | 08-124795 | 5/1996 |
| JP | 08-163122 | 6/1996 |
| JP | 08-172025 | 7/1996 |
| JP | 09-284077 | 10/1997 |
| JP | 09-284078 | 10/1997 |
| JP | 9-294041 | 11/1997 |
| JP | 11-21456 | 8/1999 |
| JP | 11-214256 | 8/1999 |
| JP | 11-223396 | 8/1999 |
| JP | 11-294908 | 10/1999 |
| JP | 11-305302 | 11/1999 |
| JP | 11-319222 | 11/1999 |
| JP | 11-345273 | 12/1999 |
| WO | WO 91/1546 | 10/1991 |
| WO | WO 98/45921 | 10/1998 |
| WO | WO 99/19982 | 4/1999 |
| WO | WO 99/37008 | 7/1999 |
| WO | WO 99/52210 | 10/1999 |
| WO | WO 00/16446 | 3/2000 |
| WO | WO 00/65740 | 11/2000 |
| WO | WO 00/74197 | 12/2000 |
| WO | WO 00/77907 | 12/2000 |
| WO | WO 01/10000 | 2/2001 |
| WO | WO 01/41232 | 6/2001 |
| WO | WO 01/41233 | 6/2001 |
| WO | WO 01/45119 | 6/2001 |
| WO | WO 01/71908 | 9/2001 |
| WO | WO 01/75916 | 10/2001 |
| WO | WO 01/84581 | 11/2001 |
| WO | WO 01/86774 | 11/2001 |
| WO | WO 02/59401 | 1/2002 |
| WO | WO 02/11160 | 2/2002 |
| WO | WO 02/15360 | 2/2002 |
| WO | WO 02/33798 | 4/2002 |
| WO | WO 02/127794 | 4/2002 |
| WO | WO 02/45233 | 6/2002 |
| WO | WO 02/65606 | 8/2002 |
| WO | WO 02/080330 | 10/2002 |
| WO | WO 03/005541 | 1/2003 |
| WO | WO 2004/070905 | 8/2004 |
| WO | WO 2005/002018 | 1/2005 |
| WO | WO 2005/015719 | 2/2005 |
| WO | WO 2005/065097 | 7/2005 |

OTHER PUBLICATIONS

PCT International Search Report for PCT/US01/44681, Jan. 2, 2003.
Greb, "An Intuitive Approach to EM Fields," EMC Test & Design, pp. 30-33, Jan. 1, 1994.
Greb, "An Intuitive Approach to EM Coupling," EMC Test & Design, pp. 20-25, Dec. 1, 1993.
Sakamoto, "Noiseproof Power Supplies: What's Important in EMI Removal Filters?" JEE, pp. 80-85, Jun. 1, 1986.
Montrose, "Analysis on Loop Area Trace Radiated Emissions from Decoupling Capacitor Placement on Printed Circuit Boards," IEEE, pp. 423-428, Jan. 1, 1999.
Miyoshi, "Surface Mounted Distributed Constant Type Noise Filter," IEEE, pp. 157-160, Jan. 1, 1999.
Shigeta et al., "Improved EMI Performance by Use of a Three-Terminal-Capacitor Applied to an IC Power Line," IEEE, pp. 161-164, Jan. 1, 1999.
PCT International Search Report for PCT/US99/07653, Jul. 19, 1999.
IPER for PCT/US99/07653, Oct. 13, 1999.
U.S. Appl. No. 10/479,506, Claims 1-46 from Preliminary Amendment filed Dec. 10, 2003.
U.S. Appl. No. 10/189,339, Claims 1-41 from Preliminary Amendment filed Oct. 28, 2003.
U.S. Appl. No. 10/443,792, Claims 1-41 from Preliminary Amendment filed Oct. 28, 2003.
PCT International Search Report for PCT/US98/06962, Aug. 19, 1998.
PCT International Search Report for PCT/US99/01040, Apr. 19, 1999.
PCT International Search Report for PCT/US00/11409, Sep. 18, 2000.
PCT International Search Report for PCT/US00/14626, Sep. 13, 2000.
PCT International Search Report for PCT/US00/16518, Nov. 8, 2000.
PCT International Search Report for PCT/US00/21178, Dec. 28, 2000.
Fang et al., "Conductive Polymers Prolong Circuit Life," Design News, date unknown, 3 pages.
Carpenter, Jr. et al., "A New Approach to TVSS Design," Power Quality Assurance, p. 60-63, Sep. 1/Oct. 1996.
Raychem, "Polyswitch Resettable Fuses," Circuit Protection Databook, pp. 11-18, Jan. 1, 1996.

PCT International Search Report for PCT/US01/41720, Dec. 28, 2001.
PCT International Search Report for PCT/US01/09185, Jun. 13, 2001.
Polka et al., "Package-Level Interconnect Design for Optimum Electrical Performance," Intel Technology Journal Q3, pp. 1-17, Jul. 1, 2000.
PCT International Search Report for PCT/US01/43418, May 10, 2002.
PCT International Search Report for PCT/US01/32480, Mar. 13, 2002.
PCT International Search Report for PCT/US02/10302, Aug. 19, 2002.
PCT International Search Report for PCT/US02/21238, Feb. 28, 2003.
PCT International Search Report for PCT/US01/13911, Mar. 18, 2002.
PCT International Search Report for PCT/US91/02150, Jul. 16, 1991.
PCT International Search Report for PCT/US01/03792, Jun. 28, 2001.
"Johanson Dielectrics, Inc. Licenses X2Y Circuit Conditioning Technology," Press Release, Dec. 16, 1998, 1 page.
Beyne et al., "PSGA—an innovative IC package for single and multichip designs," Components, pp. 6-9, Mar. 1, 1997.
"EMC Design for Brush Commutated DC Electric Motors," Sep. 15, 1997, pp. 1-2.
"Tomorrow's Capacitors," Components, No. 4, p. 3, Apr. 1, 1996.
Mason, "Valor—Understanding Common Mode Noise," Mar. 30, 1998, pp. 1-7.
Anthony Anthony et al., Pending specification, claims, figures for U.S. Appl. No. 10/237,079, Claims 21-81; filed Sep. 9, 2002.
David Anthony et al., Pending specification, claims, figures for U.S. Appl. No. 10/776,000, Claims 1-63; filed Jan. 29, 2004.
William Anthony, Pending specification, claims, figures for U.S. Appl. No. 10/399,630, Claims 1-35; filed Aug. 27, 2003.
Anthony Anthony et al., Pending specification, claims, figures for U.S. Appl. No. 10/432,840, Claims 1-39; filed May 28, 2003.
William Anthony, Pending specification, claims, figures for U.S. Appl. No. 10/443,482, Claims 1-25; filed Jun. 12, 2003.
Anthony Anthony et al., Pending specification, claims, figures for U.S. Appl. No. 10/435,199, Claims 1-32; filed May 12, 2003.
Anthony Anthony et al., Pending specification, claims, figures for U.S. Appl. No. 10/115,159, Claims 1-31; filed Apr. 2, 2002.
Anthony Anthony et al., Pending specification, claims, figures for U.S. Appl. No. 10/189,338, Claims 1-69; filed Jul. 2, 2002.
Anthony Anthony et al., Pending specification, claims, figures for U.S. Appl. No. 10/189,339, Claims 1-41; filed Jul. 2, 2002.
Anthony Anthony et al., Pending specification, claims, figures for U.S. Appl. No. 10/479,506, Claims 1-46; filed Dec. 10, 2003.
Anthony Anthony, Pending specification, claims, figures for U.S. Appl. No. 10/443,764, Claims 26-40; filed Sep. 16, 2003.
Anthony Anthony, Pending specification, claims, figures for U.S. Appl. No. 10/443,792, Claims 1-41; May 23, 2003.
Anthony Anthony, Pending specification, claims, figures for U.S. Appl. No. 10/443,788, Claims 1; 21-45; filed May 23, 2003.
Anthony Anthony et al., Pending specification, claims, figures for U.S. Appl. No. 10/443,778, Claims 1; 21-59; filed May 23, 2003.
Anthony Anthony et al., Pending specification, claims, figures for U.S. Appl. No. 10/460,361, Claims 1-16; filed Jun. 13, 2003.
Anthony Anthony et al., Pending specification, claims, figures for U.S. Appl. No. 10/705,962, Claims 19-33; filed May 25, 2005.
Anthony Anthony, Pending specification, claims, figures for U.S. Appl. No. 10/369,335, Claims 1-20; Feb. 18, 2003.
Anthony Anthony et al., Pending specification, claims, figures for U.S. Appl. No. 09/647,648, Claims 1-48; filed Nov. 17, 2000.
Anthony Anthony, Pending specification, claims, figures for U.S. Appl. No. 10/328,942, Claims 1-20; filed Dec. 23, 2002.
Anthony Anthony et al., Pending specification, claims, figures for U.S. Appl. No. 09/632,048, Claims 1-20; filed Aug. 3, 2000.
Anthony Anthony et al., Pending specification, claims, figures for U.S. Appl. No. 09/996,355, Claims 1-73; filed Nov. 29, 2001.
Willian Anthony, Pending specification, claims, figures for U.S. Appl. No. 10/023,467, Claims 1-20; filed Dec. 17, 2001.
Weir, et al., "DesignCon 2005, High Performance FPGA Bypass Networks", Jan. 1, 2005.
Pending claims 1-40 and figures (3 pages) for U.S. Appl. No. 10/399,590; the specification is contained in WO 02/33798, filed Oct. 17, 2001, which is the published version of PCT/US01/32480, which is Neifeld Reference: X2YA0015UPCT-US, which is reference F-063 in the Information Disclosure Statement filed Apr. 23, 2004, Apr. 25, 2002.
PCT International Search Report for PCT/US04/00218, Feb. 11, 2005.
PCT International Search Report for PCT/US04/14539, Feb. 18, 2005.
Australian Patent Office Examination Report for SG, 200303041-8; Neifeld Ref: X2YA0025UPCT-SG, Mar. 24, 2005.
PCT International Search Report for PCT/US04/18938, Apr. 11, 2005.
Muccioli, "EMC Society Seattle and Oregon Chapters—New X2Y Filter Technology Emerges as Singles Component Solution for Noise Suppression", Nov. 2000.
PCT Corrected IPER for PCT/US04/00218, Sep. 27, 2005.
Supplementary Partial European Search Report EP 99916477, Nov. 18, 2005.
Supplementary European Search Report EP 98915364, Oct. 27, 2005.
PCT ISR for PCT/US04/39777, Dec. 9, 2005.
EP Examination Report for 99916477.5-2215, May 8, 2006.

* cited by examiner

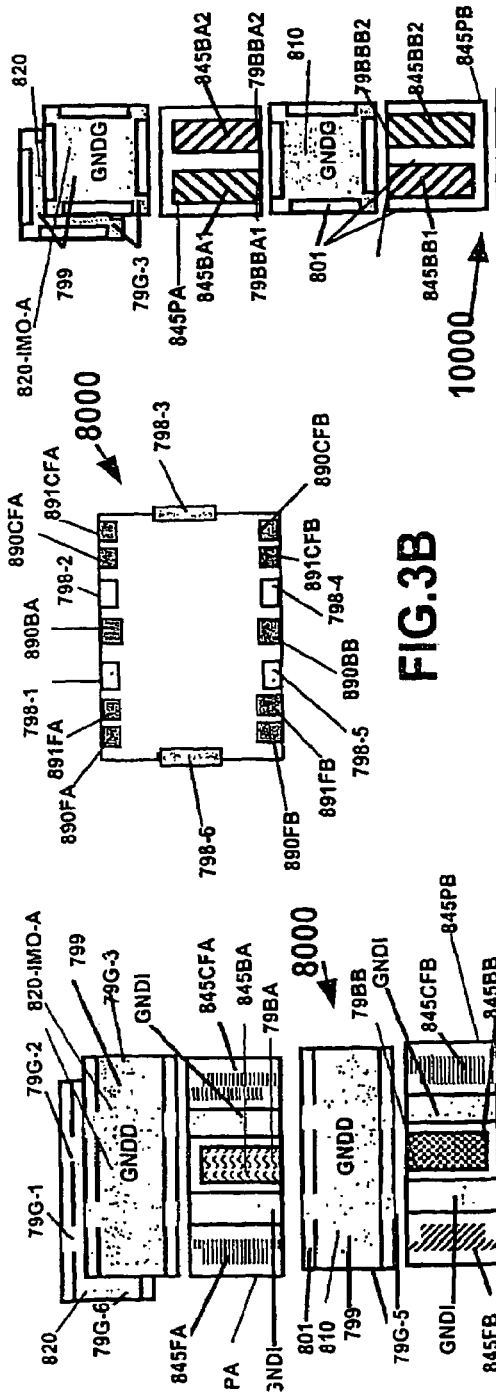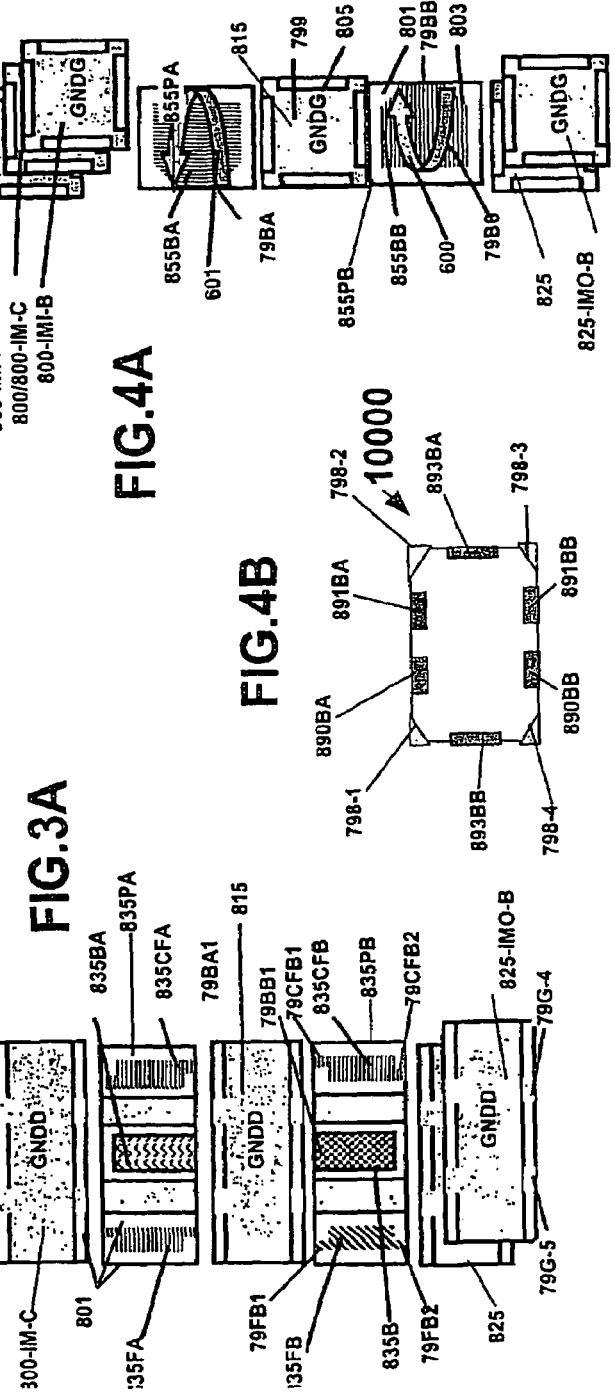
FIG.3A
FIG.3B
FIG.4A
FIG.4B

AMALGAM OF SHIELDING AND SHIELDED ENERGY PATHWAYS AND OTHER ELEMENTS FOR SINGLE OR MULTIPLE CIRCUITRIES WITH COMMON REFERENCE NODE

This application is a continuation of application Ser. No. 10/399,590, filed Aug. 14, 2003, which is a US national stage entry of PCT/US01/32480, filed Oct. 17, 2001, which claims the benefit of U.S. Provisional Application No. 60/241,128, filed Oct. 17, 2000. Application Ser. No. 10/399,590 and provisional application 60/241,128 are incorporated by reference.

TECHNICAL FIELD

The present new embodiment relates to a predetermined amalgam that uses a single electrode shielding set selectively amalgamated in a predetermined sequential combination with complementary electrodes and/or groupings of the complementary electrodes and other predetermined elements so to result in an electrode architecture practicable to provide multiple energy conditioning functions upon propagating energy portions. Amalgamation variants can be simultaneously operable to provide not only single common voltage reference functions to one circuit, but provide common voltage reference functions to multiple, separated circuit systems simultaneously, while performing multiple, dynamic energy conditioning operations.

BACKGROUND OF THE INVENTION

Today, as the density of electronic embodiments in societies throughout the world is increasing, governmental and self-imposed standards for the suppression of electromagnetic interference (EMI) and protecting electronics from that interference have become much stricter. Only a few years ago, the primary causes of interference were from sources and conditions such as voltage imbalances, spurious voltage transients from energy surges, human beings, or other electromagnetic wave generators.

At higher operating frequencies, line conditioning of propagating energy portions using prior art components have led to increased levels of interference in the form of EMI, RFI, and capacitive and inductive parasitics. These increases are due in part to the inherent manufacturing imbalances and performance deficiencies of the passive component that create or induce interference into the associated electrical circuitry when functioning at higher operating frequencies. EMI can also be generated from the electrical circuit pathway itself, which makes shielding from EMI desirable.

Differential and common mode noise energy can be generated and will usually traverse along and around cables, circuit board tracks or traces, high-speed transmission lines and bus line pathways. In many cases, these critical energy conductors act as an antenna radiating energy fields that aggravate the problem even more.

In other energy conditioning areas such as for high frequency decoupling for instance, a novel and unique approach is to provide an amalgam and/or amalgam circuit arrangement that is integral both in functional ability, as well as physical make-up that allows physically close in position, multiple groupings of energy pathways or electrodes to operate dynamically in close electrical proximity to one another while sharing a common energy reference node simultaneously when facilitated by at least an electrode or energy pathway shielding structure found along with these in other elements in one electrode arrangement amalgam.

A need has been found for a predetermined amalgam manufactured and made operable for use as an energy conditioning circuit embodiment that utilizes at least one shielding electrode structure relative to all circuitry.

A need has also been found for multiple circuit arrangements that that will allow a single common static structure relative to all circuitry, that functions for dynamic shielding of propagating complementary energy portions operating along respective complementary electrode pairs that will also provide a common, low impedance energy pathway operable as a dynamic energy reference node.

SUMMARY OF THE INVENTION

The present invention overcomes current limitations in the art by providing an energy conditioning component or amalgam, which is practicable to be operable to simultaneously provide conditioning functions to a plurality of circuits when energized. These and other advantages are provided by an amalgam comprising at least a first complementary means for conditioning a first circuit, a second complementary means for conditioning a second circuit, and a means for shielding that allows the first and the second complementary means for conditioning to be individually shielded as part of a grouping and to be shielded from each other as well. These and other advantages will be come apparent with reference to the following drawings and description.

BRIEF DESCRIPTION OF THE DRAWINGS

FIG. 3A shows an exploded plan view of an embodiment 8000, which is a multi-circuit common mode and differential mode energy conditioner comprising three separate complementary energy pathway pairs, including (1) cross-over feed-thru pairing, (1) straight feed-thru paring and (1) bypass paring with co-planar shielding, all a variant in accordance with the present configurations;

FIG. 3B shows a top view of a portion of a component 8000 of FIG. 3A in accordance with the present configurations;

FIG. 4A shows an exploded plan view of a embodiment 10000, which is a multi-circuit common mode and differential mode energy conditioner comprising three separate complementary bypass energy pathway pairs, of which (2) pairings are co-planar, all a variant in accordance with the present configurations;

FIG. 4B shows a top view of a portion of a component 10000 of FIG. 4A in accordance with the present configurations;

DETAILED DESCRIPTION OF THE EMBODIMENTS

Figure 1:
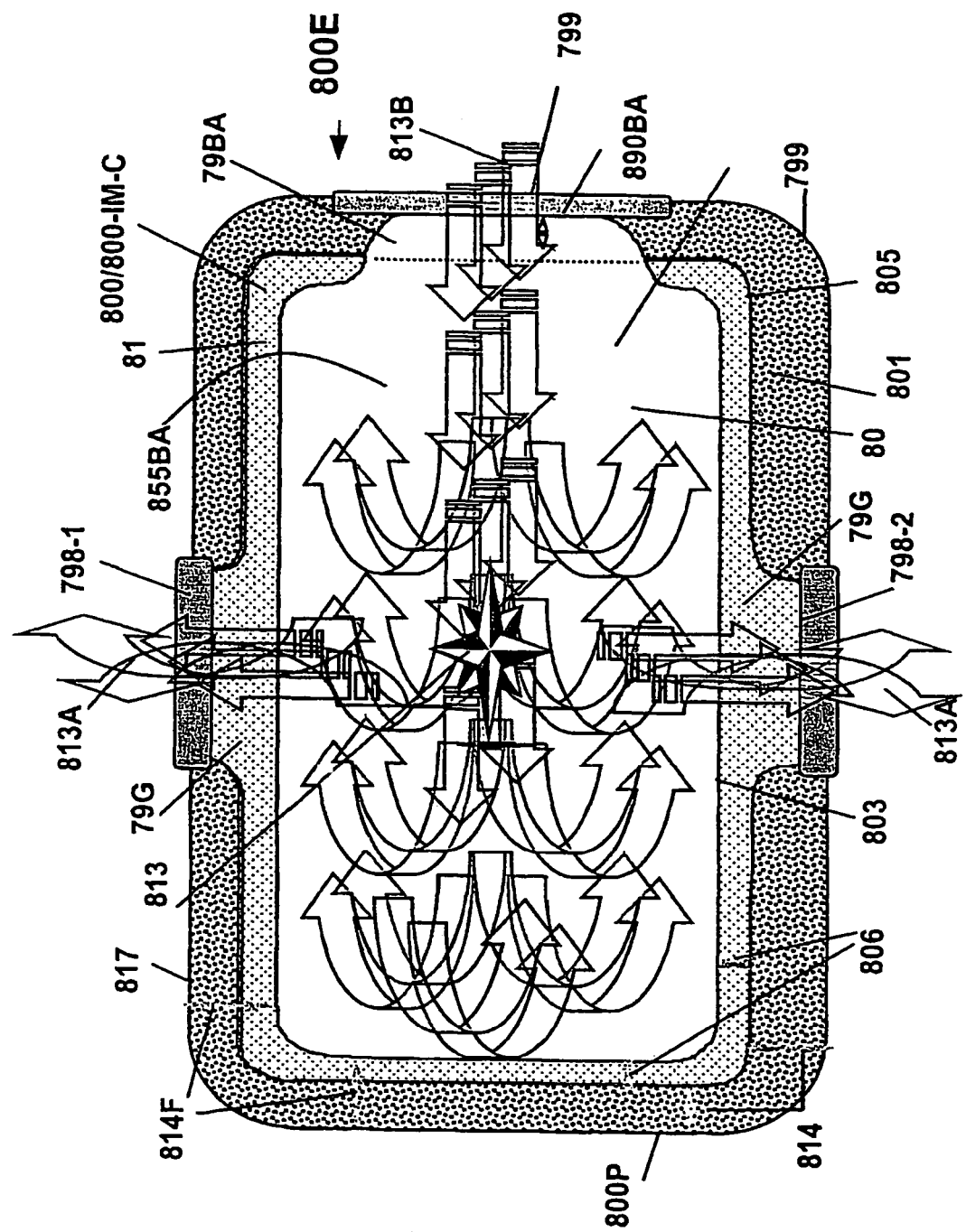
FIG. 1 shows a top view of a portion of embodiment 6000 of FIG. 2A, in accordance with the present configurations.

For brevity, the word as used throughout the entire disclosure will be the term 'amalgam' as defined by a posing in the dictionary with clarification help provided herein as what the applicant means. An amalgam may be comprising a "general combination that comprise among others diverse or similar elements in harmonious combination having a mixture of single and/or grouped, conductive, semi-conductive and non-conductive material elements arranged in various material compositions and formats and made into an energy conditioning embodiment that is also using both relative and non-relative, single and/or grouped dimensional relationships, size relationships, space-apart, spaced-near, contiguous, non-contiguous relationship arrangements and positionings with non-alignments, alignments, complementary pairings, superposing, off-setting space or spaced alignments and 3-demensional relationships all amalgamated together to form an embodiment operable for a dynamic use and/or state". This term is not, "any of various alloys of mercury with other metals" one usually finds as first definition listing of amalgam in a dictionary. Thus, amalgam will be used for disclosure purposes herein to encompass various typical amalgam and/or amalgam circuit arrangement as described, in a generalized manner.

In addition, as used herein, the acronym term "AOC" for the words "predetermined area and/or space of physical convergence and/or junction" which is normally defined as either a discrete or non-discrete version of the amalgam or amalgam circuit arrangement's relative boundaries of influence for energy conditioning that will normally include the physical boundary of manufactured-together amalgam and/or amalgam circuit arrangement elements to which electrons in motion and using the amalgam and/or amalgam circuit arrangement elements, as disclosed The present amalgam and/or amalgam circuit arrangement also relates to both discreet and non-discrete versions of an electrode arrangement having an operability for multiple-circuit operations simultaneously and comprising a conductively coupled, multi-electrode shielding arrangement architecture that will almost totally envelope various paired and/or complementary-paired, electrodes operable for 'electrically complementary' operations (that meaning is the condition or state practicable or operable for opposing electrical operations to occur, relative to the other).

An amalgam can comprise various homogenously mixed and/or heterogeneously mixed energy propagation modes such as bypass and/or feed-through modes or operations to simultaneously shield and smooth energy conditioning operations for a plurality of circuits. The new amalgam has been found to facilitate multiple energy conditioning functions operable upon various energy portions that are propagating along portions of the new embodiments' multiple complementary electrodes and/or single or multiple circuitry portions and while utilizing a common reference node function supplied by the conductively 'grounded' plurality of first electrodes or plurality of shield electrodes.

As for almost all embodiments of the present amalgam and/or amalgam circuit arrangement, the applicants contemplates a manufacturer having the option for combining a wide variety and wide range of possible materials that could be selected and combined into the final make-up of the amalgam and/or amalgam circuit arrangement while still maintaining all of the desired degrees of energy conditioning functions within the typical amalgam and/or amalgam circuit arrangement after it is normally manufactured and placed into a set of circuits and energized.

A material with predetermined properties 801 is normally interposed and non-conductively coupled in substantially all points surrounding the various electrodes of the arrangement, with the exception of predetermined locations normally found with each of the various electrodes of the arrangement, which are utilized for conductive coupling. Substances and/or a material with predetermined properties 801 will offer both energy insulation functions for the various electrodes of the arrangement, as well as providing for a casement and/or structural support; the proper spaced-apart distances required between the various shielded and shield electrodes of the arrangement. These elements for the most part, are oriented in a generally enveloping and adjoining relationship with respect to the electrode pathways that are extending into and thru either in a singularly and/or grouped, predetermined pairings, and/or groups of electrode pathway elements that will include many of the various combinations.

It should also be noted that portions of material having predetermined properties 801, and/or planar-shaped portions of material 801 having single ranges of predetermined properties is not always essential in some, other versions of the amalgam or amalgam circuit arrangement. Embodiments of various types of spacing-apart mediums, insulators, dielectric, capacitive materials, and/or inductive, ferro-magnetic, ferrite, varistor materials can comprise the material 801, as well as compounds or combinations of materials having individually or any combination of properties of insulators, dielectric, capacitive materials, varistor, metal-oxide varistor-type material, ferro-magnetic material, ferrite materials and/or any combination thereof could be used for spacing apart energy pathways of the embodiments.

For example, amalgam and/or amalgam arrangements comprising a material 801 having ferrite properties and/or any combination of ferrites would provide a stronger, inductive characteristic that would add to the electrode's already inherent resistive characteristic. In addition, at least some sort of spacing normally filled by a dielectric, a non-conductive, and/or a semi-conductive mediums, a dielectric type of material, material with predetermined properties and/or a medium with predetermined properties all described in the disclosure can be referred to as simply insulators, and/or even a non-conductive material portion.

Plates and/or portions of material 801, material 801 combinations and/or laminates of material 801 are not practicable for receiving electrode material deposits such as a self-supporting electrode and/or a material that was either processed and/or chemically 'doped' where another spacing matter such as air and/or any other spacing is used. In more detail, materials for composition of the embodiment such as dielectric materials for example, can comprise one and/or more layers of material elements compatible with available processing technology and is normally not limited to any possible dielectric material. These materials may be a semiconductor material such as silicon, germanium, gallium-arsenate, gallium-arsenide and/or a semi-insulating and/or insulating material and the like such as, but not limited to any K, high K and low K dielectrics and the like, but the embodiment is normally not limited to any material having a specific dielectric constant, K.

One and/or more of a plurality of materials like 801 and/or a combination of such, having different electrical characteristics from one another, can also be maintained between the shield electrodes and/or shielding electrode pathways and the shielded electrodes and shielded electrode pathways of the arrangement. Small versions of the amalgam and/or amalgam circuit arrangement, architecture and variants that are a few millimeters thick and/or less can embody many alternate electrode and material with predetermined properties such as a material with dielectric properties comprised of layers, up to 1,000 and/or more. Thus, the smaller sized amalgams or amalgam sub-circuit assemblies can just as well utilize elements comprising the spacing material 801 used by the nano-sized electrodes such as ferromagnetic materials and/or ferromagnetic-like dielectric layers, inductive-ferrite dielectric derivative materials. Although these materials also provide structural support in most cases of the various predetermined electrode pathway(s) within a typical embodiment, these materials with predetermined properties also aid the overall embodiment and circuits that are energized in maintaining and/or by aiding the simultaneously and constant and uninterrupted energy portion propagations that are moving along the predetermined and structurally supported, various predetermined electrode pathway(s) as these conductors are actually a portion of a circuit network and/or network of circuits.

Electrode and/or conductor materials suitable for electrode and/or electrode pathways may be selected from a group consisting of Ag, Ag/Pd, Cu, Ni, Pt, Au, Pd and/or other such metals. A combination these metal materials of resistor materials are suitable for this purpose may include an appropriate metal oxide (such as ruthenium oxide) which, depending on the exigencies of a particular application, may be diluted with a suitable metal. Other electrode portions, on the other hand, may be formed of a substantially non-resistive conductive material. The electrodes themselves can also use almost any substances or portions of materials, material combinations, films, printed circuit board materials along with any processes that can create electrode pathways from formally non-conductive and/or semi-conductive material portions; any substances and/or processes that can create conductive areas such as, but not limited to, doped polysilicon, sintered polycrystalline(s), metals, and/or polysilicon silicates, polysilicon silicate, etc. are contemplated by the applicant.

To reiterate, the embodiment is normally not limited to any possible conductive material portion such as magnetic, nickel-based materials. This also includes utilizing additional electrode structural elements comprising conductive and nonconductive elements multiple electrode pathways of different conductive material portion compositions, conductive magnetic field-influencing material hybrids and conductive polymer sheets, various processed conductive and nonconductive laminates, straight conductive deposits, multiple shielding, relative, electrode pathways utilizing various types of magnetic material shields and selective shielding, conductively doped and conductively deposited on the materials and conductive solder and the like, together, with various combinations of material and structural elements to provide the user with a host and variety of energy conditioning options when utilizing either discrete and/or non-discrete typical amalgam and/or amalgam arrangements and/or configurations that is normally predetermined before manufacturing and/or placement into a larger electrical system for energization.

The electrode arrangement manufacturing tolerances of opposing complementary electrode pathways and the capacitive balances found between a commonly shared, central electrode pathway of a portion of the electrode arrangement can be found when measuring opposite sides of the shared, shield electrode arrangement structure and can easily be maintained at capacitive or magnetic levels that originated at the factory during manufacturing of the amalgam arrangement, even with the use of common non-specialized dielectrics and/or electrode conductive material portions such as X7R, which are widely and commonly specified among prior art discrete units. Because the an amalgam is designed to operate in electrically complementary operations simultaneously at A-line to A-line couplings as well as at least (2) A-line to C-line and B-Line to C-Line (C-Line being a conductive area, GnD or reference potential that is mutually shared a result, complementary capacitive balance and/or tolerance balancing characteristic of this type of energy circuit due to element positioning, size, separations as well as coupling positioning allow an electrode arrangement that is normally for example, manufactured at 1% capacitive tolerance internally, will pass to an attached and/or coupled (conductively) and energized circuit a maintained and correlated 1% capacitive tolerances between an electrically and/or charge opposing and paired complementary energy electrode pathways within the electrode arrangement with respect to the dividing shielding electrode structures when placed into a system.

When and/or after a specific and/or predetermined structured layer arrangement is normally manufactured, it can be shaped, buried within, enveloped, and/or inserted into various energy systems and/or other sub-systems to perform line conditioning, decoupling, and/or aid in modifying a transmission of energy to a desired energy form and/or electrical shape. This electrode arrangement will allow an amalgam and/or amalgam circuit arrangement configuration to utilize the voltage dividing and balancing mechanisms of opposing pressures found internally among the grouped, adjacent amalgam and/or amalgam circuit arrangement elements, and allow for a minimized hysteresis and piezoelectric effect overall through out the elements comprising the electrode arrangement that translates the voltage dividing structure into a new embodiment that substantially minimizes and reduces the effect of material hysteresis and piezoelectric effect and/or phenomenon normally found in the prior art to such a degree that portions of propagating energies that would normally be disrupted and/or lost to these various effects are essentially retained in the form of amalgam and/or amalgam circuit arrangement energy available for delivery abilities to any active component undergoing a switching response and the time constraints needed to be overcome for providing instantaneous energy propagation to an energy-utilizing load coupled to an amalgam and/or amalgam circuit arrangement circuit arrangement.

This allows these electrically and/or charge opposing complementary electrode pathways to be located both electrically and physically on the opposite sides of the same, centrally positioned and shared common shielding electrode pathway(s) and/or electrode(s), thus this effect of the interpositioning of central and shared shielding, common electrode(s) that are not of the shielded electrode pathways also creates a voltage dividing function that actually divides various circuit voltage utilizations in half and provides each of the oppositely paired complementary conductors, one half of the voltage energy normally expected from circuitry not containing the electrode arrangement architecture. Only because the paired shielded electrodes are opposing one another electrically and/or in a charge-opposing manner between an interpositioned shielding and relative, common conductors and/or electrodes pathways not of the complementary pathways, one can recognize that a voltage dividing relationship exists within an energized circuitry. The energized circuitry comprising complementary conductors within the electrode arrangement are always balanced as a whole, electrically and/or in a charge-opposing manner, internally, and with respect to a centrally positioned shielding, common and shared pathway electrode(s) relative to each circuit system member and/or portion comprising an amalgam and/or amalgam circuit arrangement.

Each common circuit system member and/or portion comprising an amalgam and/or amalgam circuit arrangement is normally attached and/or coupled (conductively) to a common area and/or common electrode pathway to provide an external common zero voltage for what is termed a "0" reference circuit node of the amalgam and/or amalgam circuit assemblies for energy relationships with various portions of propagating energies found within each of the at least multiple circuitries comprising at least an AOC portion of an amalgam and/or amalgam circuit arrangement.

As described a properly attached amalgam and/or amalgam circuit arrangement whether discrete and/or non-discrete will almost always aid in achieving a simultaneous ability to perform multiple and distinct energy conditioning functions such as decoupling, filtering, voltage balancing using parallel positioning principals for plurality of separate and distinct circuits, which are almost always relative to the energy Source, paired energy pathways, the energy utilizing load and the energy pathways returning back to the Source to complete the circuit. This also includes the opposing but electrically canceling and complementary positioning of portions of propagated energy acting upon the electrodes in a balanced manner on opposite sides of a "0" Voltage reference created simultaneously using the pivotal centrally positioned common and shared electrode pathway. This ability allows the arrangement to appear as an apparent open energy flow simultaneously on both electrical sides of a common energy reference (the first plurality of electrodes) along both energy-in and energy-out pathways that are connecting and/or coupling from an energy source to a respective load and from the load back to the source for the return. This generally almost always-parallel energy distribution scheme allows the material make up of normally, but not always, all of the manufactured amalgam and/or amalgam circuit arrangement elements to operate together more effectively and efficiently with the load and the Source pathways located within a circuit. By operating in a complementary manner material stress in significantly reduced as compared to the prior art. Thus, phenomena such as elastic material memory and/or hysteresis effect in minimized.

The amalgam and/or amalgam circuit arrangement is essentially and electrode arrangement and a circuit arrangement utilizing the new electrode arrangement in such a manner as will be described to exploit the nature of the amalgam and/or amalgam circuit arrangement's architecture, the physical and energy dividing structure created. Conductive coupling and/or conductive attachment of the odd integer numbered plurality of electrodes to an external conductive area can include, among others, various standard industry attachment/coupling materials and attachment methodologies that are used to make these materials operable for a conductive coupling, such as soldering, resistive fit, reflux soldering, conductive adhesives, etc. that are normally standard industry accepted materials and processes used to accomplish standard conductive couplings and/or couplings. These conductive coupling and/or conductive attachment techniques and methods of the amalgam and/or amalgam circuit arrangement to an external energy pathway can easily be adapted and/or simply applied in most cases, readily and without any additional constraints imposed upon the user. Conductive coupling of electrode pathways either together or as a group to an external common area and/or pathway allows optimal effect of the other energy conditioning functions provided by the amalgam and/or amalgam arrangement such as mutual cancellation of induction, mutual minimization of mutually opposing conductors while providing passive component characteristics needed by the end users. There are at least three shielding functions that occur within the electrode arrangement as a result of the amalgamated plurality of electrodes when conductively coupled to one another are used for shielding, some functions dependant upon other variables, more than others.

First, a physical shielding function for RFI noise. RFI shielding is normally the classical "metallic barrier" against all sorts of electromagnetic fields and is normally what most people believe shielding is normally about. One technique used in the amalgam and/or amalgam circuit arrangement is normally a predetermined positioning manner of the shielding, relative, but shielding, common electrode pathways in relationship to the contained and paired complementary electrode pathways operating by allowing for the insetting of the paired complementary electrode pathways' conductive area as it is normally positioned between at least one common electrode pathway against its paired complementary electrode pathway mate that is normally the same size and as close in size and compositions as manufacturing will allow for ideal functionality of energy conditioning.

Secondly, a physical shielding of paired, electrically opposing and adjacent complementary electrode pathways accomplished by the size of the common electrode pathways in relationship to the size of the complementarily electrode pathway/electrodes and by the energized, electrostatic suppression and/or minimization of parasitics originating from the sandwiched complementary conductors, as well as, preventing external parasitics not original to the contained complementary pathways from conversely attempting to couple on to the shielded complementary pathways, sometimes referred to among others as parasitic coupling. Parasitic coupling is normally known as electric field ("E") coupling and this shielding function amounts to primarily shielding the various shielded electrodes electrostatically, against electric field parasitics. Parasitic coupling involving the passage of interfering propagating energies because of mutual and/or stray parasitic energies that originate from the complementary conductor pathways is normally suppressed within the new electrode arrangement. The electrode arrangement Blocks capacitive coupling by almost completely enveloping the oppositely phased conductors within universal shielding structure with conductive hierarchy progression that provide an electrostatic and/or Faraday shielding effect and with the positioning of the layering and pre-determined layering position both vertically and horizontally (inter-mingling). Coupling to an external common conductive area not conductively coupled to the complementary electrode pathways can also include areas such as commonly described as an inherent common conductive area such as within a conductive internally positioned motor shell which itself, which is normally not necessarily subsequently attached and/or coupled (conductively) to a chassis and/or earth conductive pathway and/or conductor, for example, a circuit system energy return, chassis conductive pathway and/or conductor, and/or PCB energy pathway and/or conductor, and/or earth ground. The utilization of the sets of internally located common electrode pathways will be described as portions of energy propagating along paired complementary electrode pathways, these energy portions undergo influence by the amalgam and/or amalgam circuit assemblies' AOC and can subsequently continue to move out onto at least one common externally located conductive area which is not of the complementary electrode pathways pluralities and thus be able to utilize this non-complementary energy pathway as the energy pathway of low impedance for dumping and suppressing, as well as blocking the return of unwanted EMI noise and energies from returning back into each of the respective energized circuits.

Finally, there is a third type of shielding that is normally more of a energy conductor positioning 'shielding technique' which is normally used against inductive energy and/or "H-Field" and/or simply, 'energy field coupling' and is normally also known as mutual inductive cancellation and/or minimization of portions of "H-Field" and/or simply, 'energy field' energy portions that are propagating along separate and opposing electrode pathways. However by physically shielding energy while simultaneously using a complementary and pairing of electrode pathways with a predetermined positioning manner allowing for the insetting of the contained and paired complementary electrode pathways within an area size as that is normally constructed as close as possible in size to yield a another type of shield and/or a 'shielding technique' called an enhanced electrostatic and/or cage-like effects against inductive "H-Field" coupling combining with mutual cancellation also means controlling the dimensions of the "H-Field" current loops in a portion of the internally position circuit containing various portions of propagating energies.

Use of the amalgam and/or amalgam circuit arrangement can allow each respective, but separate circuits operating within the amalgam and/or amalgam circuit arrangement to utilize the common low impedance pathway developed as its own voltage reference, simultaneously, but in a sharing manner while each utilizing circuit is potentially maintained and balanced within in its own relative energy reference point while maintaining minimal parasitic contribution and/or disruptive energy parasitics 'given back' into any of the circuit systems contained within the amalgam and/or amalgam circuit arrangement as it is normally passively operated, within a larger circuit system to the other circuits operating simultaneously but separately from one another. The electrode shielding arrangement or structure will within the same time, portions of propagating circuit energies will be provided with a diode-like, energy blocking function of high impedance in one instant for complementary portions of opposing and shielded energies that are propagating contained within portions of the AOC with respect to the same common reference image, while in the very same instant a energy void or anti-blocking energy function of low impedance opposite the instantaneous high impedance is operable in an instantaneous high-low impedance switching state that is occurring correspondingly, but between opposite sides of the common energy pathway in a diametrically electromagnetic manner, at the same instant of time always relative to the portions of energies located opposite to one another in a balanced manner along opposite sides of the same, shared shielding arrangement structure in an electrically harmonious manner.

Sets of internally located common electrode pathways are conductively coupled to the same common externally located conductive area not of the complementary electrode pathways to allow all circuit systems to utilize this non-complementary energy pathway as the energy pathway of low impedance simultaneously relative to each operating circuit system for dumping and suppressing, as well as blocking the return of unwanted EMI noise and energies from returning back into each of the respective energized circuit systems. Because of a simultaneous suppression of energy parasitics attributed to the enveloping shielding electrode structure in combination with the cancellation of mutually opposing energy "H" fields attributed to the electrically opposing shielded electrode pathways, the portions of propagating energies along the various circuit pathways come together within the various AOCs of the amalgam and/or amalgam circuit arrangement to undergo a conditioning effect that takes place upon the propagating energies in the form of minimizing harmful effects of H-field energies and E-field energies through simultaneous functions as described within the various AOCs of the amalgam and/or amalgam circuit arrangement that also contains and maintains a relatively defined area of constant and dynamic simultaneous low and high impedance energy pathways that are respectively switching yet are also located instantaneously, but on opposite sides of one another with respect to the utilization by portions of energies found along paired, yet divided and shielded and complementary electrode pathways' propagation potential routings.

Figure 2A:
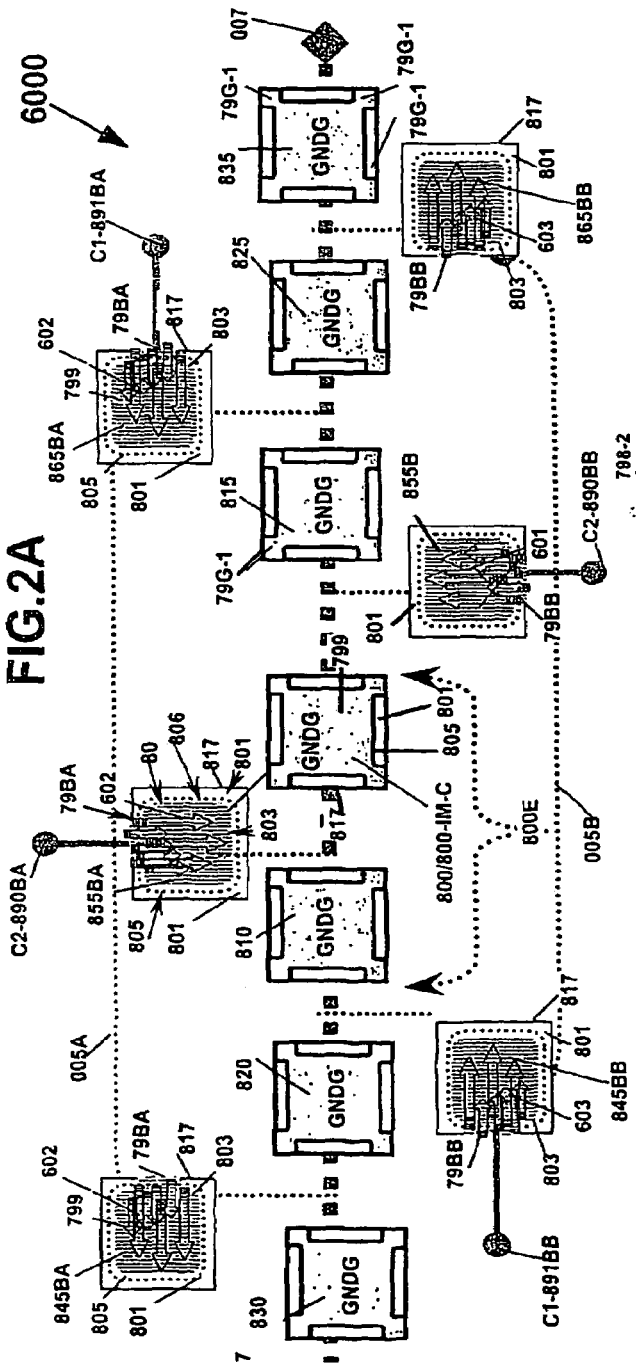
FIG. 2A shows an exploded plan view of an embodiment 6000, which is a multi-circuit common mode and differential mode energy conditioner comprising two separate complementary energy pathway pairs in accordance with the present configuration, as disclosed.

FIG. 1 shows a portion of a shielding electrode 800/800-IM which is showing a portion of a sandwiching unit 800E as best shown in FIG. 2A comprising a predetermined, positioned central shared, common shielding electrode 800/800-IMC arranged upon a structure material portion 800-P which comprises a portion of material 801 having predetermined properties.

In FIG. 2, the shielded electrodes 845BA, 845BB, 855BA, 855BB, 865BA, 865BB are generally shown as the smaller sized electrodes of the two sets of electrodes of the second plurality of electrodes. In this configuration, the smaller sized, main-body electrode portion 80 is being utilized by energy portion propagations 813B while the larger sized, main-body electrode portion 81 of the shielding electrode 800/800-IM of FIG. 1 and of the single shielding structure 4000 (not shown) is handling the energy portion propagations 813A moving outward from the center portion of the shielding electrode and the AOC center area of influence 813 shown in FIG. 1.

Referring again to FIG. 1, moving away, in both directions, from a centrally positioned common shielding electrode 800/800-IM, are electrodes and/or electrode pathways 855BB and 855BT (not shown), respectively, that both simultaneously sandwich in a predetermined manner, center shielding electrode 800/800-IM. It is important to note that the main-body electrode portion 81 of each shielding electrode of the plurality of shield electrodes is larger than a sandwiching main-body electrode portion 80 of any corresponding sandwiched shielded electrode of the plurality of shielded electrodes. The plurality of shielded electrodes are normally configured as being shielded as bypass electrodes, as described herein and/or not, however shielded feed-thru electrodes are normally configured, as well upon the need.

A manufacturer's positioning of conductive material 799 as electrode 855BA creates an inset area 806 and/or distance 806, and/or spacing area 806, which is relative to the position of the shield electrodes 800 relative to the shielded electrodes 855BA. This insetting relationship is normally better seen and/or defined as the relative inset spacing resulting from a sizing differential between two main-body electrode portions 80 and 81, with main-body electrode portion 81 being the larger of the two. This relative sizing is in conjunction as well as with a placement arrangement of various body electrode portions 80 and 81 and their respective contiguous electrode portion extensions designated as either 79G and/or 79"X"X" herein, all of which are positioned and arranged during the manufacturing process of sequential layering of the conductive material 799 and/or 799"X" that in turn will form and/or result with the insetting relationship and/or appearance found between electrode perimeter edges designated 803 of a respective electrode main-body portion 80 and the electrode perimeter edges designated 805 of the larger respective electrode main-body portion 81, respectively.

It should be noted always, that the size of all electrode main-body portion 80*s* and/or the size of all electrode main-body portion 81*s* for any of the respective electrodes can be all of the same shape as well, respectively (as manufacturing tolerances allow) within any typical amalgam and/or amalgam arrangement (or can be mixed per individual sub-circuit arrangement relative to another sub-circuit arrangement electrode set) and insetting positioning relationships can be optional.

However to enjoy increased parasitic energy portion suppression and and/or shielding of various parasitic energy portions, the insetting of complementary electrodes comprising a electrode main-body portion 80 within the larger-sized main-body shield electrode 81*s* comprising an electrode main-body portion 81 should be done to accomplish this function of parasitic energy portion suppression. This immuring by insetting of complementary electrodes also enhances the larger and overall shielding electrode structure's effectiveness for dynamic shielding of energies as compared to configurations utilizing an arrangement that does not use insetting of predetermined electrode main-body portion 80*s* within at least the predetermined electrode main-body portion 80*s* of two larger electrodes.

The insetting distance 806 can be defined as a distance multiplier found to be at least greater than zero with the inset distance being relative to a multiplier of the spaced-apart distance relationship between an electrode main-body portion 80 and an adjacent electrode main-body portion 81 of the electrodes that comprise an electrode arrangement. The multiplier of the spaced-apart thickness of the material with predetermined properties 801 found separating and/or maintaining separation between two typical adjacent electrode main-body portion 80S and an electrode main-body portion 81 within an embodiment can also be a determinant. For example, electrode main-body portion 80 of 855BB is normally stated as being 1 to 20+ (or more) times the distance and/or thickness of the material with predetermined properties 801 found separating and/or maintaining separation between electrode 855BB's electrode main-body portion 80 and adjacent center co-planar electrode 800-IM's electrode main-body portion 81 of FIG. 1.

Internal electrodes will comprise a main-body electrode 80 having at least a first lead or extension portion designated 79"XZ", "X"="B"=Bypass or "F"=Feed-thru depending upon propagation to be used, "Z"=extension of an electrode "A" or "B" and finally, if needed "#"=the numbered unit where there is a more than one extension portion per main-body electrode. For example, FIG. 1 uses a 79BA as the extension of electrode 855BA. A complementary main-body electrode 80 of 855BA, but not shown having at least a first lead or extension portion as well would be designated 79BB, as the first and second lead or extension portions of electrodes 855BA and 855BB (not shown) are arranged complementary opposite to the other in this arrangement.

It should be noted that the applicant also contemplates various size differentials that would also be allowed between the various electrode main-body portions designated as 80 of a plurality of co-planar arranged, electrodes in any array configuration. Although not shown, the portion and/or layer of a material with predetermined properties 801 can include additional co-planar arranged, electrode layering. Respective outer electrode portion(s) and/or electrode material portion 890A, 890B, and/or designated 890"X", 798-1, 798-2, and/or designated 798-"x" (not all shown) for each plurality of electrodes to facilitate common conductive coupling of various same plurality electrode members can also facilitate later conductive coupling of each respective plurality of electrodes to any external conductive portion (not shown), energy pathway (not all shown).

Focusing on the electrode extension portions that are contiguous to each respective electrode main-body portion 80 and/or 81, electrode main-body portion 80*s* are normally spaced apart but physically inset a predetermined distance to create an inset area 806. The electrode main-body portion 80 is normally smaller-sized (compared to the adjacent main-body shield electrode 81*s*) and superposed within the area coverage of each of the at least two spaced apart, but larger electrode main-body portion 81*s* of two shield electrodes with the only exceptions being the electrode extensions (if any) like 79BA of FIG. 1 for example, that are each operable for a subsequent conductive coupling to a point beyond the electrode main-body portion 80 from which it is contiguously and integrally apart of.

It should be noted, that same manufacturing process that might place the 79"XX" lead electrode and/or extension portions non-integral and/or contiguously at the same time and/or process and could very well apply an 79"XX" (not shown) later in manufacturing of certain variants of a new electrode arrangement. This later applied extension type is normally allowed, but it is with the understanding that energy operations that would utilize electrode main-body portion 80 and a non-contiguous/integrally produced 79"XX" portion would still be need to be conductively coupled in a manner that would be allow approximately condition to be considered substantially operable.

In substantially all versions of the electrode arrangement, main-body electrodes can be normally defined by two major, surface areas but shaped to a perimeter to form an electrode main-body portion 80 and/or 81 of each respective electrode element to which normally a general area size can be measured. These electrode main-body portion areas 80 and/or 81 will not include any electrode portion considered to be of the 79G and/or 79"XX" lead electrode and/or electrode extension portion(s) contiguously coupled.

There is normally no precise way of determining the exact point where an electrode main-body portion 80 and/or 81 ends and where a 79G and/or 79"XX" extension electrode portion begins and/or starts for a typical shielded electrode and/or shielding electrode other than it is normally safe to say that to define the extension, the electrode main-body portion 80 for a typical shielded electrode will be considered to be the area that is substantially positioned for creating a predetermined distance and/or an average of a predetermined distance 806 that is found between and/or within the common perimeter and/or the average common perimeter of a shielding electrode edge 805 of an adjacent shielding electrode of the shielding electrode plurality that form common shielding electrode perimeter edges 805 from common superposed arrangement of a predetermined number of electrode main-body portion 81*s* which could be any number odd integer number greater than one of common electrode members for shielding the shielded electrode grouping found within an electrode arrangement embodiment. Thus this is to include at least three shield electrodes for shielding complementary electrodes that are paired within the electrode arrangement with respect to the electrode main-body portion 80's of the at least two shielded electrodes. The same conductive material 799 can comprise all electrodes of the electrode arrangement and thus, while the electrode arrangement can have heterogeneous by predetermined electrode materials arranged in a predetermined manner, homogenous electrode materials 799 are equally sufficient.

Minimally there are always at least two pluralities of electrodes, a first plurality of electrodes where each electrode is of substantially the same size and shape relative to one another. These electrodes of the first plurality of electrodes will also be coupled conductively to each other and aligned superposed and parallel with one another. These common electrodes are also spaced-apart from one another so as to facilitate the arrangement of various members of the second plurality in a corresponding relative relationship to one another within the superposed shielding arrangement which irregardless of the rotational axis of a superposed grouping with respect to the earths' horizon will also be called a stack or stacking of the first plurality of electrodes. Within this arrangement or superposed stacking will also comprise at least portions of material(s) having predetermined properties. The total integer number of a minimal configuration of superposed electrodes of the first plurality is always an odd-numbered integer greater than one.

These electrodes could also be conductively coupled to one another by at least one contiguous portion of conductive material that provides common conductive coupling along at least an edge each electrode of the of the common grouping of electrodes that would allow the plurality to be considered, or to function as a non-grounded single common conductive structure, a non-grounded shielding conductive cage or a non-grounded Faraday cage. Obviously, when the structure is conductively coupled to an external potential, a state of grounding would be created.

The electrodes of the second plurality of electrodes make up two groupings or sets of electrodes of the second plurality of electrodes which are divided into one half of the number of electrodes as a first set of electrodes and are than considered complementary to the remaining set of electrodes correspondingly paired to each other as a complementary pairing of electrodes, respectively (It is noted that these sets themselves can be further characterized as pluralities of electrodes in accordance with the description below).

All are spaced-apart from one another if the are co-planar in arrangement with electrodes of the first set on one co-planar layering, while the second set of electrodes is correspondingly on a second co-planar layering of electrodes. The total number of the second plurality is always even integer. And while each electrode of a specific complementary pairing of electrodes are of substantially the same size and the same shape, a second complementary pairing of electrodes that are also spaced-apart from one another of substantially the same size and the same shape do not necessarily have to correspond as being individually of substantially the same size and the same shape as members of the first complementary pairing of electrodes as is depicted in FIGS. 3A and 4A

It should also be noted that as part of the overall electrode arrangement in any amalgam, the first pair of electrodes (shielding) and the second pair of electrodes (shielded) maintain an independence of size and shape relationships. While the first pair of electrodes and the second pair of electrodes of the second plurality of electrodes can comprise all electrodes of substantially the same size and the same shape, it is not a requirement. Only as a pair of electrodes, 'individually', do these complementary electrode pairs need to be maintained as two electrodes of the same size and the same shape relative to each other so that a complementary relationship is created between specifically paired electrodes.

For another example, while the second pair of electrodes could be the same size as the first pair of electrodes, the second pair of electrodes could still be of a different shape than that of the first pair of electrodes. Again, the converse holds true. Other pairs of electrodes added beyond the at least two pairs of electrodes would also maintain this independence of size and shape from that of the first two pairs of electrodes as part of an overall, new electrode arrangement amalgam.

To begin, this disclosure of embodiments below will provide a small variety of possible electrode combinations, each relative to a particular embodiment as shown, but universal to the main objective of the disclosure. The main objective of the disclosure is to provide a shielding and shielded electrode arrangement with other elements in-combination for allowing at least two independent and electrically isolated circuit systems to mutually and dynamically utilize one defined discrete or non-discrete electrode arrangement amalgam, internally.

Accordingly, the passive architecture, such as utilized by the amalgam and/or amalgam circuit arrangement, can be built to condition and/or minimize the various types of energy fields (h-field and e-field) that can be found in an energy system. While the amalgam and/or amalgam circuit arrangement is normally not necessarily built to condition one type of energy field more than another, it is contemplated that different types of materials can be added and/or used in combination with the various sets of electrodes to build an embodiment that could do such specific conditioning upon one energy field over another. The various thicknesses of a dielectric material and/or medium and the interpositioned shielding electrode structure allow a dynamic and close distance relationship with in the circuit architecture to take advantage of the conductive areas propagating energies and relative non-conductive or even semi-conductive distances between one another (the complementary energy paths).

Figure 2C:
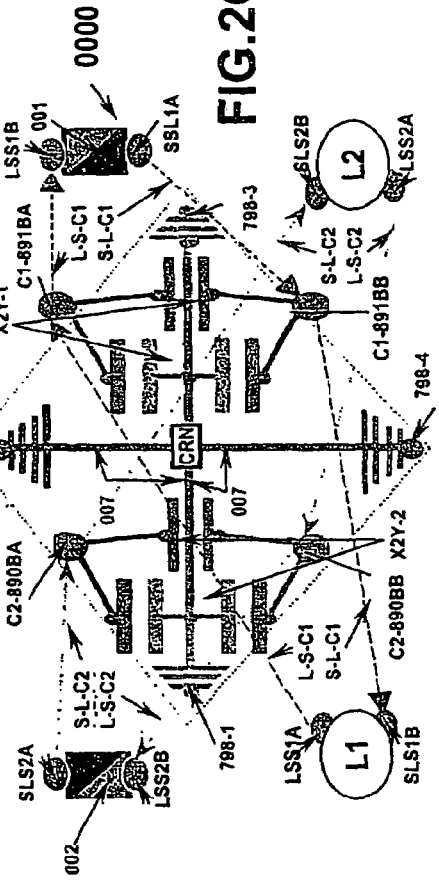
FIG. 2C shows a circuit schematic of two isolated circuits sharing a single common reference node as disclosed in FIG. 2A and FIG. 2B.

This objective entails groupings of predetermined elements selectively arranged with relative predetermined, element portioning and sizing, along with element spaced-apart and positional relationships combined to also allow these at least two independent and electrically isolated circuit systems to mutually and dynamically utilize, simultaneously, one common circuit reference potential or node provided in part by the shielding portion of the given amalgam and in conductive combination with a common voltage potential of a conductive portion located beyond the amalgam AOC 813 before conductive coupling of the plurality of shielding electrodes conductively is enlarged and integrated to this outside conductive area (like a 007) as part of at least a minimal, amalgam circuit arrangement with common reference node 000, as depicted in FIG. 2C.

Amalgam configurations shown herein include FIG. 2A, FIG. 3A and FIG. 4A with embodiments 6000, 8000 and 10000, respectively. Of these embodiments, there are at least three multi-circuit amalgam arrangements that can be defined within this disclosure; a straight vertical multi-circuit arrangement, a straight horizontal multi-circuit arrangement and a hybrid of the vertical/horizontal multi-circuit arrangements, each in its own integrated configuration. Generally, an amalgam will comprise at least two internally, located circuit portions, both of which (each internally located circuit portion) are considered to be part of one larger circuit system, each and not of the other, respectively.

Each circuit portion can comprise portions of a first and a second energy pathway, each of which is in some point considered part of the amalgam itself, within the AOC. These first and second energy pathways for each isolated circuit system the first and the second external portions of the respective energy pathways exist as energy pathways of either the energy source and the energy utilizing load portions located for complementary electrical operations relative to the other as part of the circuit system. Each internally located circuit portion is coupled the first and the second energy pathway portions (that are external of the amalgam) at respective and predetermined corresponding portions of the internal circuit portions found within the amalgam's AOC.

Conductively coupled with portions of the amalgam made at predetermined locations can be done by a predetermined conductive coupling process or manner with the materials or predetermined physical coupling techniques and predetermined materials used in the electrical coupling art, such as solder or resistive fitting, etc. These internal circuit portions can be considered the electrode pathways, or the complementary energy pathways as described above. Generally internal circuit portions, as described will not comprise the shield electrodes, of which these shielding energy pathways are insulated or isolated from a directive electrical coupling by at least a spaced apart within the arrangement by portions usually comprising the material having predetermined properties 801.

A first and a second circuit systems (C1/C2 of FIG. 2C for example) having the at least two circuit portions respectively, will each (C1/C2—the circuit systems) further comprise at least an energy source, an energy-utilizing load, at least a first energy pathway, at least a second energy pathway. Each circuit system will generally begin with the first energy pathway leading from a first side of the energy source, which can be considered a supply-side of the energy source, and then a first energy pathway is subsequently coupled to a first side of the energy utilizing load, which is considered the energy input side of the energy utilizing load.

It is further recognized that the point of the energy source and the coupling made to the energy utilizing load is for the first energy pathway what is the consideration determinate to calling out that this position conductively isolates the first energy pathway electrically from the positioning arrangement of the second first energy pathway which is also physically coupled between the energy utilizing load, and the energy source as the return energy pathway to the source. Thus, at least the second energy pathway which is found leaving a second side of the energy source and which is considered the return-out side of the energy utilizing load (after portions of energy have been converted by the load for use or work) and is then coupled to a second side of the energy-utilizing load, which is considered the energy return-in side of the energy source.

The one notable differences of the three multi-circuit amalgam arrangements called out are; a vertical multi-circuit amalgam arrangement comprises an arrangement that results in the circuit portions being placed or stacked over the other yet in a relationship that is not necessarily opposite or complementary to the other circuit system portion of the electrical operations that occur, but rather oriented in an arrangement that allows a "null" interaction between the two circuit systems to take place within the amalgam while both electrical circuit systems are commonly sharing voltage reference facilitated by the 'grounded' the shielding structure that is comprised of the electrodes of the first plurality of electrodes that have been coupled conductively to each other and conductively coupled to an otherwise external conductive portion not necessarily of the any one respective circuit system.

It is contemplated that in some cases coupling to one portion of the complementary energy pathways might be desirable for some users such that this arrangement of biasing or favoring one circuit system over another with the conductive coupling of the isolated, shield electrode structure is fully contemplated by the applicant. However when isolation of the shielding structure is maintained, the path of least impedance created with coupling to a non-complementary energy pathway of the circuit systems involved will dynamically create a low impedance conductive pathway common to energies of the at least two isolated circuit systems as they are operable stacked for operations relative to the other, one above the other relative to at least a respective positioning that reveals such a stacked or adjacent arrangement between the plurality.

Figure 2B:
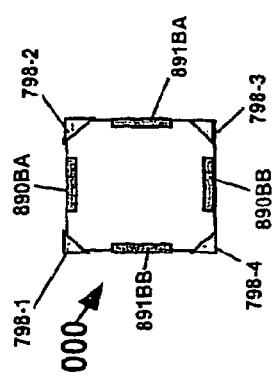
FIG. 2B shows a top view of a portion of a discrete component 6000 version of FIG. 2A in accordance with the present configuration, as disclosed.

Referring now to FIGS. 2A-2B, an embodiment of an amalgam 6000. The amalgam 6000 is shown in FIG. 2A in an exploded view showing the individual electrode layerings formed on layers of material 801 as discussed above. A predetermined, amalgamated, shielding, electrode structure of FIG. 2A is a predetermined shielding, electrode arrangement comprising an odd integer number of equal-sized, shield electrodes designated 835, 825, 815, 800/800-IM, 810, 820, 830, and 840, as well as any optional shield electrodes (not shown) for image plane shield electrodes designated -IMI"X" and/or -IMO"X" disclosed below.

Amalgam 6000 comprises at least a first plurality of electrodes of substantially the same shape and the same size designated 835, 825, 815, 800/800-IM, 810, 820, 830, and 840 and a second plurality of electrodes of substantially the same shape and the same size designated 845BA, 845BB, 855BA, 855BB, 865BA and 865BB that are combined in configurations various sub-plurality configurations of the original two pluralities of electrodes for combinations possible that provide the amalgam any possible numbers of homogeneously grouped electrodes also gathered in sets to comprise the first plurality of electrodes with the second plurality of electrodes.

The amalgam 6000 is capable of being coupled to four pathways 003A, 003B and 004A, 004B, of two 90-degree orientations of at least two independent and electrically isolated circuit systems (C1-C2) to mutually and dynamically utilize in an electrically null fashion with respectively to the other as later depicted in FIG. 2C.

A first combination of the number of plurality configurations or combinations possible for the amalgam is one that includes the first plurality of electrodes with the second plurality of electrodes divided into at least two or four directional orientations including a configuration with at least one electrode of 855BA, 855BB, 865BA and 865BB with its respective extension 79"XX" facing at least one of four possible 90 degree orientations just like hands of a clock, as in a 9-O'clock, 12'-O'clock, 3'-O'clock, and 6-O'clock.

A second combination of the number of plurality configurations or combinations possible for the amalgam is one that includes the first plurality of electrodes with the second plurality of electrodes and further comprising the second plurality of electrodes divided as groupings of complementary pairings with an energized orientation of propagating energies oriented to at least one pairing of clock positions that are 180 degrees from the other are as a 'locked' pairing orientation themselves are oriented in one of two possible "null" or 90 degree orientations relative to one another also shown herein, just like hands of a clock, as in a 9-O'clock+ 3'-O'clock arranged "null" (in this case 90 degrees) to the 12'-O'clock+6-O'clock set.

A third combination of the number of plurality configurations or combinations possible for the amalgam is one that includes the first plurality of electrodes with the second plurality of electrodes and further comprising the second plurality of electrodes divided into at least two sets of electrodes. The first set of electrodes further comprises paired complementary electrodes groupings including complementary electrodes 845BA, 845BB and complementary electrodes 865BA, 865BB. The second of at least two sets of electrodes comprises paired complementary electrodes 845BA and 845BB. As later seen in FIG. 2C, the first set of electrodes of the second plurality of electrodes comprises portions of the first circuit of a possible plurality of circuits with complementary portions utilizing the amalgam, while the second set of electrodes of the second plurality of electrodes comprises portions of the second circuit of a possible plurality of circuits with complementary portions utilizing the amalgam.

The first plurality of electrodes and second plurality of electrodes that comprise the amalgam can also be classified a plurality of shield electrodes and a plurality of shielded electrodes. The first plurality of electrodes or the plurality of shield electrodes designated 835, 825, 815, 800/800-IM, 810, 820, 830, and 840 are also given a GNDG designation providing the common shielding structure (not numbered) when these are conductively coupled to one another an identifier in terms of 79G-"x" electrode extension orientations relative to the 6000 amalgam and the second plurality of electrodes designated 845BA, 845BB, 855BA, 855BB, 865BA and 865BB and the location and orientation of their respective 79"XX" electrode extensions, discussed above.

The plurality of GNDG electrodes are operable as shield electrodes and are conductively coupled to each other to function as a single means for shielding and will provide a pathway of least impedance for multiple circuit systems (C1 and C2, in this case) when the plurality of GNDG electrodes are as a group or structure are conductively coupled to an externally located common conductive area or pathway 007.

Another combination of the number of combinations of the first primary and the second primary plurality of electrodes in a minimal configuration 6000 has the second primary plurality of electrodes divided evenly into what is now will be described below as a second plurality of electrodes and a third plurality of electrodes which join the now simply, first plurality of electrodes as an amalgam comprising at least a first, a second and a third plurality of electrodes that are interspersed within the first plurality of electrodes designated 835, 825, 815, 800/800-IM, 810, 820, 830, and 840 functioning as shielding electrodes with each electrode of the first plurality of electrodes designated generally, as GNDG. This is done to show the ability of any electrode of the first plurality of electrodes can be shifted in function to act as the keystone 8"XX"/800-IMC central electrode of the first plurality and the amalgam as shown general electrode 810 GNDG becoming center shield electrode 810/800-IM-C of a minimal amalgam oust a two pairing of 845BA, 845BB and 855BA, 855BB of embodiment 6000 arranged as pairings that are oriented null to one another, in this case null at 90 degrees) in a multi-circuit arrangement with common reference node 0000 of FIG. 2C.

Continuing with FIG. 2A and FIG. 2B, in the sequence of electrodes, each electrode of the second and third pluralities of electrodes is stacked between at least two electrodes GNDG of the first plurality of electrodes. In addition, each paired electrode of the second and third plurality of electrodes is arranged such that the pair of electrodes sandwich at least one electrode GNDG of the first plurality of electrodes.

Accordingly, a minimum sequence of electrodes of the amalgam 6000 is a first electrode 845BA of the second plurality of paired electrodes is stacked above a first electrode GNDG and below a second electrode GNDG. A second electrode 845BB of the second plurality of paired electrodes is stacked above the second electrode GNDG and below a third electrode GNDG. A first electrode 855BA of the third plurality of paired electrodes is stacked above the third electrode GNDG and below a fourth electrode GNDG. A second electrode 855BB of the third plurality of paired electrodes is stacked above the fourth electrode GNDG and below a fifth electrode GNDG. In this minimum sequence, each electrode of the second and third pluralities of electrodes is conductively isolated from each other and from the first plurality of electrodes GNDG.

As seen in FIG. 1, in FIG. 2A, the electrode 855BA has its main-body electrode portion 80 sandwiched by electrodes 800/800-IM and 810 simultaneously. Thus, since the shield main-body electrode portion 81$s$ are of substantially the same size and shape, at the same time electrode 855BA is having each large area side of its main-body electrode portion 80 receiving the same area of shielding function relative to the other, the electrode edge 803 of its main-body electrode portion 80, is kept within a boundary 'DMZ' or area 806 established by the sandwiching perimeter of the two superposed and aligned shield main-body electrode portion 81$s$ with their electrode edge 805$s$ of the now commonly coupled shielding, electrodes 800/800-IM and 810, both of the first plurality of electrodes.

Referring now to FIG. 2B, the amalgam 6000 is shown in an assembled state. Exterior electrode bands are arranged around the conditioner body. The common shielding electrodes GNDG comprise a plurality of terminal electrode portions 79G-1 (shown in FIG. 2A) which are conductively coupled to a plurality of external electrodes 798-1-4. In the minimum sequence of electrodes discussed above, the first electrode 845BA of the second plurality of paired electrodes comprises a terminal electrode portion 79BA (shown in FIG. 2A) which is conductively coupled to external electrodes 891BA and the second electrode 845BB of the third plurality of paired electrodes comprises a terminal electrode portion 79BB (shown in FIG. 2A) which is conductively coupled to external electrode 891BB. The first electrode 855BA of the second plurality of paired electrodes comprises a terminal electrode portion 79BA (shown in FIG. 2A) which is conductively coupled to external electrodes 890BA and the second electrode 855BB of the third plurality of paired electrodes comprises a terminal electrode portion 79BB (shown in FIG. 2A) which is conductively coupled to external electrode 890BB. It is noted that the terminal electrode portions and the external electrodes of corresponding paired electrodes are arranged 180 degrees from each other, allowing energy cancellation.

In order to increase the capacitance available to one or both of the attached circuits, additional pairs of electrodes are added to the amalgam 6000. Referring again to FIG. 2A, an additional pair of electrodes 865BA, 865BB, are added to the stacking sequence which correspond in orientation with the first pair of electrodes of the second plurality of electrodes. The first additional electrode 865BA of the second plurality of paired electrodes is stacked above the fifth electrode GNDG and below a sixth electrode GNDG. A second additional electrode 865BB of the third plurality of paired electrodes is stacked above the fourth electrode GNDG and below a fifth electrode GNDG. The first additional electrode 865BA is conductively coupled to the first electrode 845BA of the second plurality of electrodes through common conductive coupling to external electrode 891BA. The second additional electrode 865BB is conductively coupled to the second electrode 845BA of the third plurality of electrodes through common conductive coupling to external electrode 891BB. It is noted that the additional pair of electrodes could be arranged adjacent the first pair of electrodes 845BA, 845BB instead of on adjacent the second pair of electrodes 855BA, 855BB. Although not shown, the capacitance available to one or both coupled circuits could be further increased by adding more additional paired electrodes and electrodes GNDG.

FIG. 2C is a multi-circuit schematic that is not meant to limit the present amalgam in a multi-circuit arrangement to the configurations shown, but is intended to show the versatility utility of the present amalgam in multi circuit operations.

A minimal amalgam (just a two pairing of 845BA, 845BB and 855BA, 855BB of embodiment 6000 arranged as pairings that are oriented null to one another, in this case null at 90 degrees) in a multi-circuit arrangement with common reference node 0000, could comprise a first means for opposing shielded energies of one circuit C1, which can comprise (a complementary portion of C1's overall circuit system and further comprising a paired arrangement of correspondingly, reverse mirror images of the complementary electrode grouping of electrodes 845BA, 845BB as seen in FIG. 2A) and a second means for opposing shielded energies of another circuit C2, which can comprise (a complementary portion of C2's overall circuit system and further comprising a paired arrangement of correspondingly, reverse mirror images of the complementary electrode grouping of electrodes 855BA, 855BB as seen in FIG. 2A) having elements individually shielded as members of a paired arrangement of correspondingly, reverse mirror images of the complementary electrode grouping of electrodes of both C1's and C2's respective circuit portions as just disclosed by at least the means for shielding (which is at least plurality of shield electrodes of substantially the same shape and the same size that are conductively coupled to one another, including at least 830, 820, 810, 800 and 815 with electrode 810 becoming 810/800-IM-C of FIG. 2A, for example) and also where the means for shielding (the plurality of shield electrodes as just described) also shields the first means for opposing shielded energies (as just described) and the second means for opposing shielded energies (as just described) from each other. This is to say that C1's and C2's respective circuit portions, respectively (as just described) are shielded from the other as at least two respective circuit portions by means for shielding as circuit portions (as just described).

FIG. 2C's multi-circuit schematic will also specifically include the whole body of multi-circuit embodiment 0000 rather than just a small portion as just described would have a full 3 pairing embodiment 6000 as shown in FIG. 2A coupled in a having two isolated circuit systems C1 and C2, respectively, each having at least a source 001, 002 and load L1, L2, each C1 and C2 of which is contributing some complementary portion of itself within the amalgam 6000, and sandwiched within and conductively isolated to one another between members of the plurality of shield electrodes. Each respective internally located circuit portion pairing of 845BA, 845BB, 855BA, 855BB and 865BA, 865BB is coupled at a corresponding first electrode or a second electrode coupling portion 891BA and 891BB, respectively. The C1 isolated circuit system is respectively coupled to the S-L-C1 external pathway portions and the L-S-C1 external pathway portions of the respective complementary energy pathways existing for both the energy source 001 and the energy-utilizing load L1 and arranged or positioned for complementary electrical operations relative to the other, at couplings SLS1A, (from source to load side 1A), SLS1B and LSS1A, LSS1B (from load to source side 1B) as part of the circuit system C1. The C1 isolated circuit system is respectively coupled to electrode coupling portions 891BA and 891BB by circuit portion conductive couplings C1-891BA and C1-891BB, respectively, which are simply standard coupling connection means known in the art. (Such as a solder coupling, for example). C1-891BB is made for the S-L-C1 external pathway by coupling with an external energy pathway group that is including couplings at SLS1A, C1-891BB, and SLS1B and is coupling to an external energy pathway group at an electrically opposite side of the 001 Source and L1 Load.

C1-891BA is made for a complementary external pathway L-S-C1 of the just mentioned S-L-C1 external pathway by coupling with an external energy pathway group that is including couplings by the second electrode-coupling portion 891BA by C1-891BA, coupling at LSS1A at the load, to 891BA of the amalgam, and to LSS1B coupled at the source return. Each coupling made respective and predetermined corresponding portions of SOURCE 1 and LOAD 1 for the appropriate opposing side of respective and predetermined corresponding portions of SOURCE 1 and LOAD 1.

Circuit 2 or C2 is the same however just substitute the #2 for the #1 at the C"X" designation and 890BA and 890BB, respectively for 891BA and 891BB of the electrode coupling portions.

Finally, 79G-1 to 79G-4 are conductively coupled common to conductive portion 007 which is providing both a voltage reference node or common reference node (CNR) equally facilitated by the 'grounded' the shielding structure that is comprised of the electrodes of the first plurality of electrodes that have been coupled conductively to each other and conductively coupled to an otherwise external conductive portion not necessarily of the any one respective circuit system, C1 or C2. One should also note that in the course of the dual operations of the minimum first two groupings of four complementary electrodes described as a multi-circuit arrangement with common reference node comprising at least a first means for opposing shielded energies of one circuit and at least a second means for opposing shielded energies of another circuit and having a means for shielding the first and the second means for opposing shielded energies both individually and from each other, respectively at least two (2) sets of capacitive networks are created individually and respectively by C1 and C2, each and comprises at least one line to line capacitor and two, line to reference line or 'GnD' capacitors each that are also integrated as a unit X2Y-1 and unit X2Y-2, respectively as depicted in FIG. 2A within the same amalgam, all as a result of what is mutually shared. (reference line being common conductive area 007, GnD or reference potential 007 that is mutually shared by both C1 and C2, a result of energization of the (2) amalgamated but isolated circuit arrangements and their respective portions, as described.)

Although FIG. 2A depicts a null arrangement position operable to being at least 90 degrees out of phase physically and in electrical operation between C1 and C2, it is considered to be both a physical and electrically null state relative to one another between C1 and C2.

In this particular configuration, although FIG. 2A is at a 90 degree physical angle that C1 and C2 that is equal to relative to the other to one another or any other directional position that allows a null interference to be considered operable for the respective h-field flux emissions that would other wise have a detrimental effect to one another is fully contemplated by the applicant. For example by pacing vertically, two circuits not necessarily 90 degrees physically oriented away from the other and placing them in a vertical separation of distance that effectively accomplishes the same nulling effect function. Added 801 material with additional -IMI-"x" shielding electrodes is one say this could be done.

Thus a null position relative to the at least two isolated circuit portion pairs could be anywhere from 1 degree to 180 degrees relative on at least two or even three axis's of positioning from a relative center point respective to the 8"XX"/-IMC center shielding electrode to develop a first position and a second position to determine a null relationship and its degree of relative effect or interference between at least two directional field flux positions of each of the respective isolated circuit portion pairs found within the new amalgam. Accordingly, relative on at least two or even three axis's of positioning from a relative center point respective to the 8"XX"/-IMC center shielding electrode, when energized, the amalgam arrangement will allow partial or full "null effect" to occur upon energy fields (if any) interacting with one another along respective a pair of isolated circuit system portions. And in accordance almost any complementary bypass and/or feed-through electrode pathway(s) can operate within the amalgam and/or amalgam circuit arrangement together AOC in a "paired electrically opposing" as complementary bypass and/or feed-through electrode pairings in a manner in which is anywhere in a physically orientation from anywhere between at least 1 to 359 degrees apart from one another, relative to positioning of the interposing shielding electrode pathways of the amalgam.

This minimum, first plurality of electrodes are also coupled conductively to one another and minimally as five members of the first plurality of electrodes have been commonly coupled become or function as a single, and substantially uniform shielding structure that provides each sandwich, respective electrode substantially the same amount of shielding area to each side of at least two opposing areas of the electrode or energy pathway receiving physical shielding. Thus the energy circuit 1 (C1) energy pathways 845BA,8865BA respectively and complementarily paired to 845BB, 865BB, while energy circuit 2 (C2) operates with complementary electrodes 855AB and 855BB, null to one another as a plurality of two isolated circuits, simultaneously. By utilizing these seven members 830,820, 810,800,815,825 and 835 of the first plurality of electrodes that have been coupled conductively to one another to function as a cage-like shielding structure grouped and conductively coupled to one another, the first plurality of electrodes provide physical and dynamic shielding of the complementary conductors 845BA, 8865BA, 845BB, 865BB, 855AB and 855BB.

This corresponding, opposite positioning arrangement of the substantially identical energy circuit 1 (C1) energy pathways comprise grouped 845BA, 8865BA complementarily paired to grouped 845BB, 865BB, respectively while circuit 2 (C2) operates with complementarily paired electrodes 855AB and 855BB. Thus, C1 and C2 are arranged 90 degrees away from the other and will be in a null relationship to one another.

Overall, embodiment 6000 in-turn will be operable coupled to C1 and C2 systems in establishing or creating a static complementary physical relationship considered as a paired, and symmetrical corresponding, opposite arrangement relationship between the two energy pathways. Since C1 energy pathways 845BA, 8865BA respectively and complementarily paired to 845BB, 865BB, while C2 operates with complementary electrodes 855AB and 855BB, null to one another are of substantially the same shape and size, overall both substantially match up or correspond relative to the other so as to match 'face to face' with their opposing surface areas of each respectively with the other.

This balanced, corresponding physical and complementary relationship between the C1 energy pathways 845BA, 8865BA respectively and complementarily paired to 845BB, 865BB, while C2 operates with complementary electrodes 855AB and 855BB, null to one another allows portions of energy found on opposite sides of a circuit system dynamic can be propagating to the degree that at the same time, two oppositely phased, energy portions will be practicable or operable to be utilizing one of the two, respective C1 energy pathways 845BA,8865BA respectively and complementarily paired to 845BB, 865BB, while C2 operates with complementary electrodes 855AB and 855BB, null to one another in a balanced and mutually complementary dynamic relationship with respect relative to the other at energization and operations of a energized amalgam arrangement selectively coupled with the C1 energy pathways 845BA,8865BA respectively and complementarily paired to 845BB, 865BB, while C2 operates with complementary electrodes 855AB and 855BB, null to one another to at least one circuit system in dynamic operation to establish and maintain a substantially balanced and ongoing, sustainable complementary electrical conditioning operation for these and any subsequent energies utilizing this AOC within a portion of an energized circuit system. The now paired energies portions with respect to the other establish a mutual h-field propagations that cancel one another according to rules establish by the science beginning with Ampere and his Law and including the life's work of Faraday, Maxwell, Tesla, Einstein, Planck and the others to be effectively cancelled upon the interaction or co-mingling of the two corresponding portions and the ensuing energy portions propagating within the dynamic.

A straight vertical multi circuit operable amalgam comprises an electrode arrangement of at least two pluralities of electrode pathways. The first plurality of electrode pathways of the two pluralities of electrode pathways comprises electrodes that are considered shield electrodes within the arrangement. The first plurality of electrode pathways can be homogeneous in physical composition, appearance, shape and size to one another. Within a vertical arrangement, members of the first plurality of electrode pathways will be arranged or positioned superposed relative to one another such that all perimeter edges 805 or even and aligned with one another. Each amalgam multi-circuit arrangement of the at least three multi-circuit amalgam arrangements will each utilize a single common conductive area as a circuit reference node during energized operations, and as a common coupled energy potential for grounding of the common shielding electrode structure of any multi-circuit amalgam arrangement.

In some cases, for vertical multi-circuit amalgam arrangements will comprise the isolated circuit arrangement portions spread horizontally, relative to one another and never stacked over the other.

Operational ability of the amalgam and/or amalgam circuit arrangement refers to conditioning of complementary propagations of various energy portions along pairings of basically the same-sized, and/or effectively and substantially the same size, complementary conductors and/or electrodes and/or electrode pathway counterparts, (with both electrode pathways) will for the most part, almost always be physically separated first by at least some sort of spacing between electrodes whether the spacing be air, a material with predetermined properties and/or simply a medium and/or matter with predetermined properties. Then the conditioning of complementary energy propagations will for the most part, also be separated by an interposing and physically larger positioning of a commonly shared, plurality of energy conductors or electrode pathways that are conductively coupled to one another and are not of the complementary electrode pathway pairs, as just described above. One should note that this structure becomes a grounded, energy pathway structure, a common energy pathway structure, a common conductive structure or a shielding structure that functions as a grounded, Faraday cage for both the sets of energy portions utilizing the complementary conductors and the complementary conductors the amalgam and/or amalgam circuit arrangement is normally capable of conditioning energy that uses DC, AC, and AC/DC hybrid-type propagation of energy along energy pathways found in energy system and/or test equipment. This includes utilization of the amalgam and/or amalgam circuit arrangement to condition energy in systems that contain many different types of energy propagation formats, in systems that contain many kinds of circuitry propagation characteristics, within the same energy system platform.

While not shown in FIG. 2A, but disclosed in FIGS. 3A and 4A, additionally placed, outer shielding electrode pathways designated as -IMO-"X" and additionally placed, inner shielding electrode pathways designated as -IMI-"X" (with the exception of 800/800-IM) are always optional. Additionally placed, outer and inner shielding electrodes are also always conductively coupled to one another, the center shield electrode, designated 800/800-IM and any other members of the plurality of shielding electrodes in a final static amalgam.

With the exception of 8"XX"/800-IM, when used there are always at least even integer number, or one pair of -IMI"X" to be sandwiching the common central shield electrode designated 800/800-IM as seen in FIGS. 4A and 4B, and when used, and of which are together also, are conductively coupled to the plurality of shielding electrodes including the common central shield electrode designated 800/800-IM in any final static amalgam.

With or without any additionally placed, inner arranged, common shielding electrode pathways designated (#IMI-"X") in place, any integer number of shield electrodes that is or are arranged as the center or center grouping of shield electrodes within the total amalgam will always be an odd integer numbered amount of shielding electrodes that is at least 1, Conversely, the total number of electrodes of the first plurality of electrodes or the plurality of shielding electrodes as a total number found within the total amalgam will always be an odd integer numbered is at least three.

Additionally placed, outer shielding electrode pathways designated as -IMO-"X" will usually increase the shielding effectiveness of an amalgam as a whole. These electrodes help provide additional shielding effectiveness from both outside and inside originating EMI relative to the amalgam and can also facilitate the essential shield electrodes not designated -IM"X"-"X" which are normally adjacent (with the exception of 8"XX"/800-IM) a shielded complementary electrode. In addition, with the exception of the center shield electrode 800/800-IM, which is relatively designated as both the center electrode of any plurality of total stacked electrodes comprising an amalgam, as well as the center electrode of the total number of electrodes comprising any plurality of first electrodes or shielding electrodes, the remaining electrodes of the first plurality of electrodes or as other wise known as the remaining electrodes of the plurality of shield electrodes will be found equally and evenly, divided to opposite sides of the center shield electrode 800/800-IM.

Thus the now two groups of remaining electrodes of the plurality of shield electrodes (excluding the shared center shield electrode 800/800-IM) will always total to an even integer number, respectively, but when taken together with the center shield electrode 800/800-IM will always total to an odd integer number of the total number of electrodes comprising the plurality of shield electrodes to work together when conductively coupled to one another as a single and shared image "0" voltage reference potential, physical shielding structure is at least three (FIG. 3A-3B).

There are few, if any exceptions to the number three other than in the case of vertically stacked isolated circuit portions (FIG. 2A-C) or hybrids (FIG. 4A-B) of the horizontal and vertical arrangements as well, there will be a need for at least five shield electrodes. Both integer numbers of electrodes will perform as well respective of the other as an electrostatic shielding structure providing an electrostatic or dynamic shielding function for energies propagating along the shielded energy pathways sandwiched within the structure as a whole, when the amalgam is energized with each respective source to load circuit systems and respective the plurality of coupled together shield electrodes now conductively coupled to a common conductive area or potential not necessarily of any of the respective source to load circuit systems including there respective circuit system energy-in or energy-out pathways.

Referring to FIG. 3A, another embodiment of a multi-circuit energy-conditioning component 8000 is shown is shown in an exploded view. In this embodiment, multiple, co-planar electrodes are positioned on a layer of material 801. In a minimum configuration, component 8000 comprises a first complementary means for conditioning a first circuit, a second complementary means for conditioning a second circuit, and a means for shielding the first and the second complementary means for conditioning individually, and from each other.

The first complementary means for conditioning a circuit is provided by a first plurality of paired complementary electrodes 845FA, 845FB. The second complementary means for conditioning a second circuit is provided by a second plurality of paired complementary electrodes 845BA, 845BB.

The means for shielding the first and the second complementary means for conditioning individually, and from each other is provided by a third plurality of electrodes referred to generally as GNDD. One electrode of each pair of the paired complementary electrodes is positioned at a predetermined location on a first layer of material 801. The corresponding second electrode is positioned in the same location on a second layer of material 801.

The first plurality of paired complementary electrodes 845FA, 845FB, and the second plurality of paired complementary electrodes 845BA, 845BB is interspersed within the third plurality of electrodes GNDD. The third plurality of electrodes GNDG provide the common shielding structure discussed above such that the third plurality of electrodes GNDG are operable as shield electrodes, which are conductively coupled to each other and provide a pathway of least impedance.

A first electrode 845FA of the first plurality of paired electrodes and a first electrode 845BA of the second plurality of paired electrodes, co-planar to each other, are stacked above a first electrode GNDD and below a second electrode GNDD. A second electrode 845FB of the first plurality of paired electrodes and a second electrode 845BB of the second plurality of paired electrodes, co-planar to each other are stacked above the second electrode GNDG and below a third electrode GNDG.

It is noted that the first plurality of paired complementary electrodes 845FA, 845FB are shown as feed through electrodes while the second plurality of paired complementary electrodes 845BA, 845BB are shown as by-pass electrodes. The electrodes can be any combination of bypass or feed-thru and is not limited to the configuration shown.

The electrodes GNDD are all conductively coupled to external electrode bands 798-1-6 discussed below, and as such are conductively coupled to each other. Conversely, the each electrode of the paired electrodes 845FA, 845FB, and 845BA, 845BB, are each conductively isolated from each other and from the electrodes of the third plurality of electrodes GNDG.

While the minimum configuration has been discussed above, additional co-planar electrode pairs can be added to the first and second pluralities of paired electrodes for conditioning coupling of additional circuits. Referring to FIG. 3A, a third plurality of paired electrodes 845CFA, 845CFB have been added in a co-planar relationship with their counterpart electrodes of the first and second pluralities of paired electrodes. These electrodes are a feed-thru variant referred to as a cross-over feed thru. Although not shown, additional co-planar electrode pairs can be added.

In another variation, electrodes GNDI are positioned in a co-planar relationship between the paired electrodes, providing additional shielding and providing a pathway of least impedance when coupled to an external common conductive area or pathway.

As previously mentioned, additional capacitance can be added to the component 8000 by adding additional layers of corresponding paired electrodes 835FA and 835FB, 835BA and 835BB, 835CFA and 835CFB, above and/or below the existing layers.

Referring to FIG. 3B, the multi-circuit, amalgam 8000 is shown in an assembled state. Exterior electrode bands are positioned around the conditioner body. The common shielding electrodes GNDD and GNDI comprise a plurality of terminal electrode portions 79G-1-6 (shown in FIG. 3A) which are conductively coupled to a plurality of external electrodes 798-1-6. The first electrode 845FA of the first plurality of paired electrodes comprises two terminal electrode portions 79FA (shown in FIG. 3A) on opposite ends which are conductively coupled to external electrodes 891FA and 891FB. The second electrode 845FB of the first plurality of paired electrodes comprises two terminal electrode portions 79FB (shown in FIG. 3A) on opposite ends which are conductively coupled to external electrodes 890FA, 890FB. The first electrode 845BA of the second plurality of paired electrodes comprises a terminal electrode portion 79BA (shown in FIG. 3A) which is conductively coupled to external electrodes 890BA and the second electrode 845BB of the second plurality of paired electrodes comprises a terminal electrode portion 79BB (shown in FIG. 3A) which is conductively coupled to external electrode 890BB. The first electrode 845CFA of the third plurality of paired electrodes comprises two terminal electrode portions 79CFA1, 79CFA2 (shown in FIG. 3A) on opposite ends which are conductively coupled to external electrodes 890CFA and 890CFB, respectively. The second electrode 845CFB of the third plurality of paired electrodes comprises two terminal electrode portions 79CFB1, 79CFB2 (shown in FIG. 3A) on opposite ends which are conductively coupled to external electrodes 891CFA, 891CFB, respectively. It is noted that the terminal electrode portions and the external electrodes of corresponding paired electrodes are positioned generally 180 degrees from each other, allowing energy cancellation.

Previous embodiments disclosed a multi-layer energy conditioner or amalgam providing multi-circuit coupling capability by adding electrodes vertically in a stacking 6000 and by adding electrodes horizontally in a co-planar stacking 8000. A variation of these embodiments is a hybrid amalgam 10000, which provides multi-circuit coupling capability for at least three circuits as shown in FIGS. 4A and 4B.

Referring now to FIG. 4A, the amalgam 10000 is shown in an exploded view showing the individual electrode layerings formed on layers of material 801 as discussed above. Conditioner 10000 comprises a first complementary means for conditioning a first circuit, a second complementary means for conditioning a second circuit, a third complementary means for conditioning a third circuit and a means for shielding the first, the second, and the third complementary means for conditioning individually, and from each other.

The first complementary means for conditioning a circuit is provided by a first plurality of paired complementary electrodes 845BA1, 845BB1. The second complementary means for conditioning a second circuit is provided by a second plurality of paired complementary electrodes 845BA2, 845BB2. The third complementary means for conditioning a third circuit is provided by a third plurality of paired complementary electrodes 855BA, 855BB.

The means for shielding the first, the second, and the third complementary means for conditioning individually, and from each other is provided by a fourth plurality of electrodes referred to generally as GNDG.

One electrode of each pair of the first and the second paired complementary electrodes are positioned at a predetermined location on a first layer of material 801. The corresponding second electrode is positioned in the same location on a second layer of material 801.

The first plurality of paired complementary electrodes 845BA1, 845BB1, the second plurality of paired complementary electrodes 845BA2, 845BB2, and the third plurality of paired complementary electrodes 855BA, 855BB are interspersed within the fourth plurality of electrodes GNDD. The fourth plurality of electrodes GNDG provide the common shielding structure discussed above such that the fourth plurality of electrodes GNDG are operable as shield electrodes, which are conductively coupled to each other and provide a pathway of least impedance when conductively coupled to an externally located common conductive area or pathway.

A first electrode 845BA1 of the first plurality of paired electrodes and a first electrode 845BA2 of the second plurality of paired electrodes, co-planar to each other, are stacked above a first electrode GNDG and below a second electrode GNDG. A second electrode 845BB1 of the first plurality of paired electrodes and a second electrode 845BB2 of the second plurality of paired electrodes, co-planar to each other are stacked above the second electrode GNDG and below a third electrode GNDG. A first electrode 855BA of the third plurality of paired electrodes is stacked above the third electrode GNDG and below a fourth electrode GNDG. A second electrode 855BB of the third plurality of paired electrodes is stacked above the fourth electrode GNDG and below a fifth electrode GNDG. In this minimum sequence, each electrode of the first, the second, and the third pluralities of electrodes is conductively isolated from each other and from the fourth plurality of electrodes GNDG.

Referring now to FIG. 4B, the hybrid amalgam 10000 is shown in an assembled state. Exterior electrode bands are positioned around the conditioner body. The common shielding electrodes GNDG comprise a plurality of terminal electrode portions 79G-1-4 (shown in FIG. 4A) which are conductively coupled to a plurality of external electrodes 798-1-4. The first electrode 845BA1 of the first plurality of paired electrodes comprises a terminal electrode portion 79BBA1 (shown in FIG. 4A) which is conductively coupled to external electrodes 890BB and the second electrode 845BB1 of the first plurality of paired electrodes comprises a terminal electrode portion 79BBB1 (shown in FIG. 4A) which is conductively coupled to external electrode 890BA. The first electrode 845BA2 of the second plurality of paired electrodes comprises a terminal electrode portion 79BBA2 (shown in FIG. 4A) which is conductively coupled to external electrodes 891 BB and the second electrode 845BB2 of the second plurality of paired electrodes comprises a terminal electrode portion 79BBB2 (shown in FIG. 4A) which is conductively coupled to external electrode 891BA. The first electrode 855BA of the third plurality of paired electrodes comprises a terminal electrode portion 79BA (shown in FIG. 4A) which is conductively coupled to external electrodes 893BB and the second electrode 855BB of the third plurality of paired electrodes comprises a terminal electrode portion 79BB (shown in FIG. 4A) which is conductively coupled to external electrode 893BA. It is noted that the terminal electrode portions and the external electrodes of corresponding paired electrodes are positioned 180 degrees from each other, allowing energy cancellation.

While all of the paired electrodes shown are bypass, the embodiment is not limited as such and may include and combination of bypass, feed-thru, and/or cross over feed-thru electrode pairs. It is noted that the terminal electrode portions and the external electrodes of corresponding paired electrodes are positioned 180 degrees from each other, allowing energy cancellation. Although not shown, the capacitance available to one, two, or all of the coupled circuits could be further increased by adding more additional paired electrodes and electrodes GNDG as previously shown in the earlier embodiments.

As has been discussed above, it is possible to support additional circuit connections by adding corresponding paired electrodes and common shield electrodes. The common shield electrodes are conductively coupled to the existing common shield structure which provides a common pathway of low impedance for all connected circuits, as well as an optimized Faraday and/or shielding, cage-like function and surge dissipation area. It is fully contemplated by the applicants that a plurality of isolated and complete circuits can have a jointly shared relative electrode shielding grouping conductively coupled to the same common energy pathway to share and provide a common voltage and/or circuit voltage reference between the at least two isolated sources and the at least isolated two loads. Additional shielding common conductors can be employed with any of the embodiments to provide an increased common pathway condition of low impedance for both and/or multiple circuits either shown and is fully contemplated by Applicant.

Additionally, almost any shape, thickness and/or size may be built of the amalgam and/or amalgam circuit arrangement and varied depending on the electrical application. As can be seen, the present amalgam(s) accomplish the various objectives set forth above. While the present amalgam(s) have been shown and described, it is clearly conveyed and understood that other modifications and variations may be made thereto by those of ordinary skill in the art without departing from the spirit and scope of the present amalgam(s).

In closing, it should also be readily understood by those of ordinary skill in the art will appreciate the various aspects and element limitations of the various embodiment elements that may be interchanged either in whole and/or in part and that the foregoing description is by way of example only, and is not intended to be limitative of the amalgam(s) in whole so further described in the appended claims forthcoming.

What is claimed is:

1. An energy conditioner structure, comprising:
    a first energy pathway formed from electrically conductive material;
    a second energy pathway formed from electrically conductive material;
    a third energy pathway formed from electrically conductive material;
    a fourth energy pathway formed from electrically conductive material;
    a shielding structure formed from electrically conductive material;
    wherein said shielding structure includes material interposed between each one of said first energy pathway, said second energy pathway, said third energy pathway, and said fourth energy pathway; and
    wherein each one of said first energy pathway, said second energy pathway, said third energy pathway, said fourth energy pathway, and said shielding structure are conductively isolated from one another inside said energy conditioner.

2. The conditioner of claim 1
    wherein said energy conditioner has an energy conditioner outer surface;
    wherein said first energy pathway has at least a first energy pathway contact portion forming part of said energy conditioner outer surface;
    wherein said second energy pathway has at least a second energy pathway contact portion forming part of said energy conditioner outer surface;
    wherein said third energy pathway has at least a third energy pathway contact portion forming part of said energy conditioner outer surface;
    wherein said fourth energy pathway has at least a fourth energy pathway contact portion forming part of said energy conditioner outer surface;
    wherein said shielding structure has at least a first shielding structure contact portion forming part of said energy conditioner outer surface; and
    wherein each one of said first energy pathway contact portion, said second energy pathway contact portion, said third energy pathway contact portion, said fourth energy pathway contact portion, and said first energy pathway contact portion are conductively isolated from one another.

3. The structure of claim 1 wherein each one of said first energy pathway, said second energy pathway, said third energy pathway, said fourth energy pathway have substantially the same size as one another.

4. The structure of claim 1 further comprising dielectric material interposed between at least two of said first energy pathway, said second energy pathway, said third energy pathway, said fourth energy pathway and said shielding structure.

5. The structure of claim 1 wherein said a first energy pathway formed from electrically conductive material consists of at least two parallel layers of electrically conductive material that are not in the same plane as one another.

6. The structure of claim 1 wherein said shielding structure provides a Faraday cage effect.

7. The conditioner of claim 1 wherein said material interposed has a generally annular shape.

8. A circuit including the structure of claim 1 further comprising a first conductive pathway connecting said conditioner to a first source of electrical power, a second conductive pathway connecting said conditioner to a second source of electrical power.

9. The circuit of claim 8 further comprising a first load powered by said first source of electrical power and a second load powered by said second source of electrical power.

10. The structure of claim 1 wherein said first energy pathway, said second energy pathway, said third energy pathway, said fourth energy pathway, and said shielding structure define a stack of conductive layers.

11. The structure of claim 10 wherein a total number of layers in said stack of conductive layers is an odd number.

12. The conditioner of claim 10 wherein said stack of layers defines a central layer, and said central layer is part of said shielding structure.

13. The structure of claim 1 wherein a layer forming said shielding structure has a large surface area than any layer forming part of said first energy pathway, said second energy pathway, said third energy pathway, and said fourth energy pathway.

14. The structure of claim 10 wherein a layer forming said shielding structure extends further in the plane defined by the major surface of each one of said conductive layers along two opposite directions than any layer of said first energy pathway, said second energy pathway, said third energy pathway, and said fourth energy pathway.

15. The conditioner of claim 10 wherein a layer forming said shielding structure extends further, in the plane defined by the major surface of each one of said stack of conductive layers, along two opposite directions and a direction perpendicular to said two opposite directions than any layer of said first energy pathway, said second energy pathway, said third energy pathway, and said fourth energy pathway.

16. An electrical circuit comprising a first source of electrical power, a first load, a second source of electrical power, a second load, and an energy conditioner of claim 1.

17. The method of claim 1 wherein said material interposed between each one of said first energy pathway, said second energy pathway, said third energy pathway, and said fourth energy pathway that forms part of said shielding structure defines at least one shielding structure layer;

wherein said first energy pathway extends in a pathway plane and has a first energy pathway surface area in said pathway plane;

wherein said at least one shielding structure layer extends parallel to said pathway plane and has an at least one shielding structure layer surface area in said pathway plane; and wherein said at least one shielding structure layer surface area is large than said first energy pathway surface area.

18. A method for making an energy conditioner structure, comprising:

providing a first energy pathway formed from electrically conductive material;

providing a second energy pathway formed from electrically conductive material;

providing a third energy pathway formed from electrically conductive material;

providing a fourth energy pathway formed from electrically conductive material;

providing a shielding structure formed from electrically conductive material;

wherein said shielding structure includes material interposed between each one of said first energy pathway, said second energy pathway, said third energy pathway, and said fourth energy pathway; and wherein each one of said first energy pathway, said second energy pathway, said third energy pathway, said fourth energy pathway, and said shielding structure are conductively isolated from one another inside said energy conditioner.

19. A method for using an energy conditioner structure, wherein said structure comprises:

a first energy pathway formed from electrically conductive material;

a second energy pathway formed from electrically conductive material;

a third energy pathway formed from electrically conductive material;

a fourth energy pathway formed from electrically conductive material;

a shielding structure formed from electrically conductive material;

wherein said shielding structure includes material interposed between each one of said first energy pathway, said second energy pathway, said third energy pathway, and said fourth energy pathway; and wherein each one of said first energy pathway, said second energy pathway, said third energy pathway, said fourth energy pathway, and said shielding structure are conductively isolated from one another inside said energy conditioner; and wherein said method comprises connecting a first pair of the energy pathways of the first, second, third, and fourth energy pathways to a first circuit.

20. The method of claim 19 further comprising connecting a second pair of the first, second, third, and fourth energy pathways to a second circuit, wherein said second pair of energy pathways consists of members of the first, second, third, and fourth energy pathways that are different from the members of said first pair of energy pathways.

* * * * *

UNITED STATES PATENT AND TRADEMARK OFFICE
Certificate

Patent No. 7,224,564 B2                                                                               Patented: May 29, 2007

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: William M. Anthony, Erie, PA (US); and Anthony A. Anthony, Erie, PA (US).

Signed and Sealed this Twenty-First Day of August 2012.

*JARED FUREMAN*
*Supervisory Patent Examiner*
Art Unit 2836
Technology Center 2800